United States Patent
Abbott et al.

(10) Patent No.: US 7,453,103 B2
(45) Date of Patent: Nov. 18, 2008

(54) SEMICONDUCTOR CONSTRUCTIONS

(75) Inventors: Todd R. Abbott, Boise, ID (US); H. Montgomery Manning, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 434 days.

(21) Appl. No.: 11/285,424

(22) Filed: Nov. 22, 2005

(65) Prior Publication Data

US 2006/0081884 A1    Apr. 20, 2006

Related U.S. Application Data

(62) Division of application No. 10/800,196, filed on Mar. 11, 2004, now Pat. No. 7,262,089.

(51) Int. Cl.
  *H01L 29/74* (2006.01)
  *H01L 31/111* (2006.01)
(52) U.S. Cl. ................ 257/135; 257/302; 257/E27.057
(58) Field of Classification Search ................ 257/135, 257/302, 328, 329, E27.057, E29.313
  See application file for complete search history.

(56) References Cited

U.S. PATENT DOCUMENTS

| | | |
|---|---|---|
| 4,549,927 A | 10/1985 | Goth et al. |
| 5,013,680 A | 5/1991 | Lowrey et al. |
| 5,071,782 A | 12/1991 | Mori |
| 5,122,848 A | 6/1992 | Lee et al. |
| 5,278,438 A | 1/1994 | Kim et al. |
| 5,574,299 A | 11/1996 | Kim |
| 5,576,567 A | 11/1996 | Mori |
| 5,874,760 A | 2/1999 | Burns, Jr. et al. |
| 5,909,618 A | 6/1999 | Forbes et al. |
| 5,929,477 A | 7/1999 | Burns, Jr. et al. |
| 5,963,469 A | 10/1999 | Forbes |
| 5,977,579 A | 11/1999 | Noble |
| 5,990,509 A | 11/1999 | Burns, Jr. et al. |
| 6,034,389 A | 3/2000 | Burns, Jr. et al. |
| 6,072,209 A | 6/2000 | Noble et al. |
| 6,096,598 A | 8/2000 | Furukawa et al. |
| 6,114,725 A | 9/2000 | Furukawa et al. |
| 6,133,105 A | 10/2000 | Chen et al. |
| 6,150,687 A | 11/2000 | Noble et al. |
| 6,159,789 A | 12/2000 | Chuang et al. |
| 6,184,091 B1 | 2/2001 | Gruening et al. |
| 6,191,470 B1 | 2/2001 | Forbes et al. |
| 6,218,236 B1 | 4/2001 | Economikos et al. |
| 6,355,520 B1 | 3/2002 | Park et al. |
| 6,399,979 B1 * | 6/2002 | Noble et al. ................ 257/302 |

(Continued)

FOREIGN PATENT DOCUMENTS

WO   PCT/US2005/006211    2/2005

OTHER PUBLICATIONS

Lattice Press "Silicon Processing for The VLSI Era, vol. 2: Process Integration" Stanley Wolf, Ph.D. (1990).

*Primary Examiner*—Thanhha Pham
(74) *Attorney, Agent, or Firm*—Wells St. John P.S.

(57) ABSTRACT

The invention includes semiconductor structures having buried silicide-containing bitlines. Vertical surround gate transistor structures can be formed over the bitlines. The surround gate transistor structures can be incorporated into memory devices, such as, for example, DRAM devices. The invention can be utilized for forming $4F^2$ DRAM devices.

36 Claims, 23 Drawing Sheets

U.S. PATENT DOCUMENTS

| | | |
|---|---|---|
| 6,440,801 B1 | 8/2002 | Furukawa et al. |
| 6,498,062 B2 | 12/2002 | Durcan et al. |
| 6,504,210 B1 | 1/2003 | Divakaruni et al. |
| 6,537,870 B1 | 3/2003 | Shen |
| 6,555,862 B1 | 4/2003 | Mandelman et al. |
| 6,579,759 B1 | 6/2003 | Chudzik et al. |
| 6,593,613 B1 | 7/2003 | Alsmeier et al. |
| 6,696,746 B1 | 2/2004 | Farrar et al. |
| 6,717,205 B2 | 4/2004 | Gratz |
| 6,844,591 B1 | 1/2005 | Tran |
| 7,071,043 B2 | 7/2006 | Tang et al. |
| 7,122,425 B2 | 10/2006 | Chance et al. |
| 7,214,621 B2 | 5/2007 | Nejad et al. |
| 7,244,659 B2 | 7/2007 | Tang et al. |
| 7,262,089 B2 | 8/2007 | Abbott et al. |
| 7,282,401 B2 | 10/2007 | Juengling |
| 7,285,812 B2 | 10/2007 | Tang et al. |
| 7,349,232 B2 | 3/2008 | Wang et al. |
| 7,384,849 B2 | 6/2008 | Parekh et al. |
| 2003/0001200 A1 | 1/2003 | Divakaruni et al. |
| 2004/0113207 A1 | 6/2004 | Hsu et al. |

\* cited by examiner

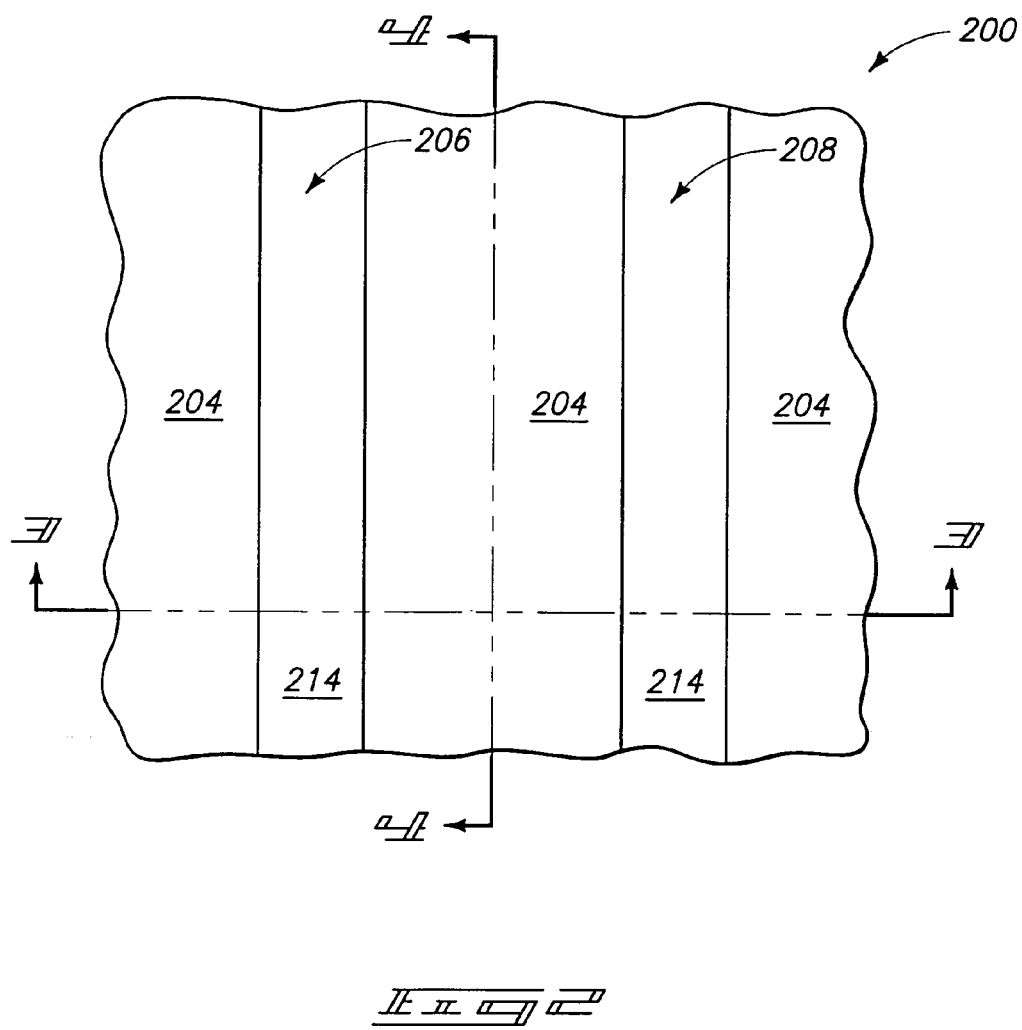

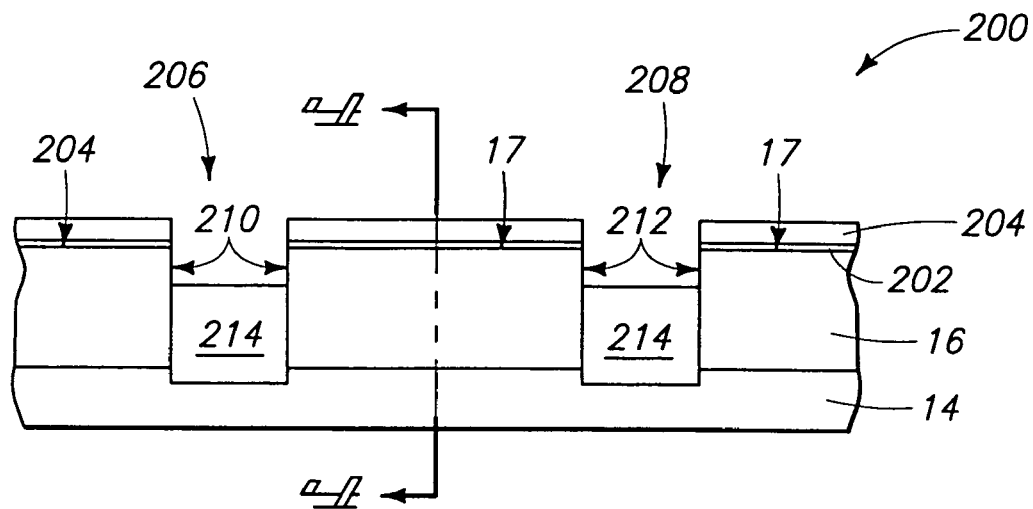
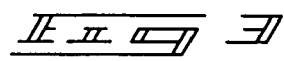
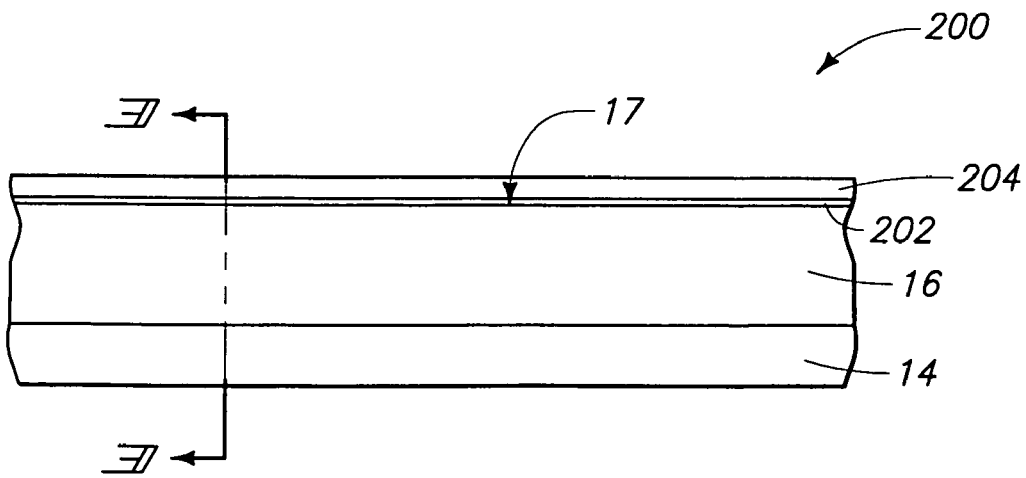
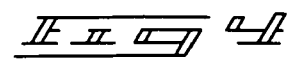

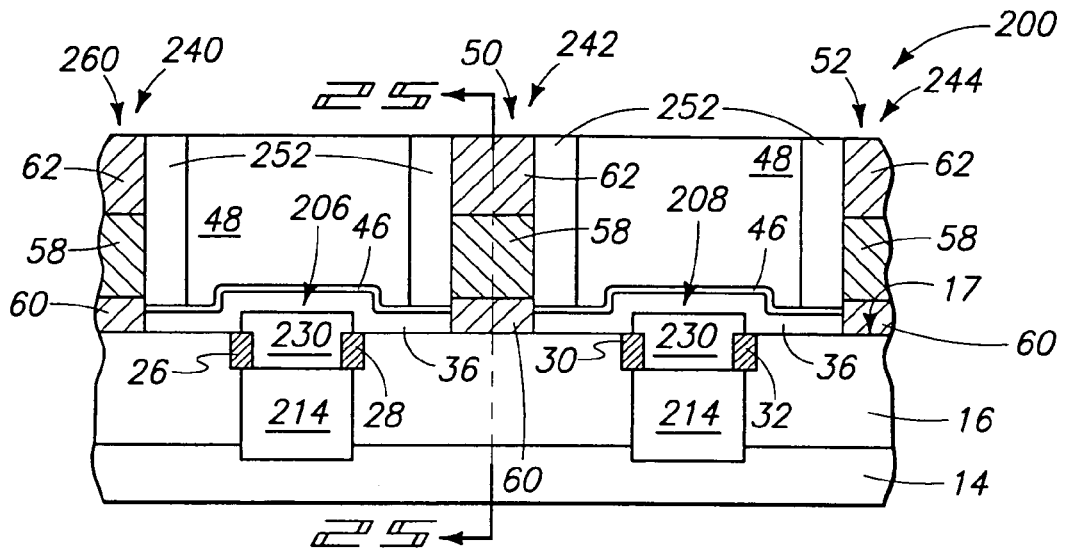
Fig. 24
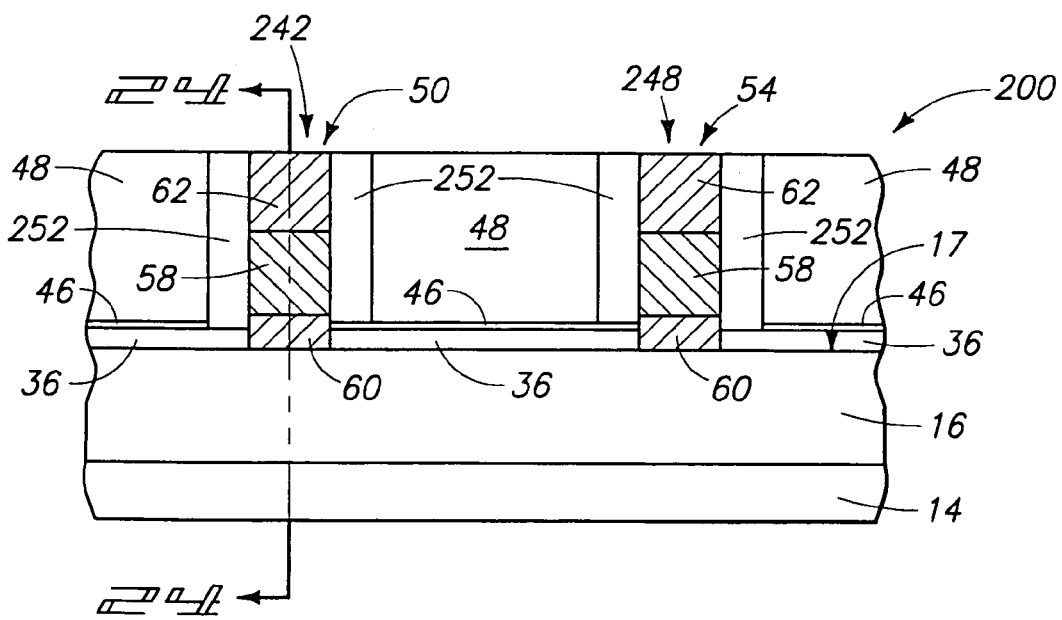
Fig. 25

SEMICONDUCTOR CONSTRUCTIONS

RELATED PATENT DATA

This patent resulted from a divisional of U.S. patent application Ser. No. 10/800,196, which was filed Mar. 11, 2004, now U.S. Pat. No. 7,262,089 and which is hereby incorporated by reference.

TECHNICAL FIELD

The invention pertains to semiconductor constructions and methods of forming semiconductor structures. In particular aspects, the invention pertains to semiconductor constructions comprising one or more buried bitlines and one or more vertical surround gate transistor (SGT) structures, and pertains to methods of forming such constructions.

BACKGROUND OF THE INVENTION

A continuing goal of semiconductor device application is to increase the level of device integration, or in other words to increase the density of devices across a supporting substrate. Methods for increasing the density can include decreasing the size of individual devices, and/or increasing the packing density of the devices (i.e., reducing the amount of space between adjacent devices). In order to develop higher levels of integration, it is desired to develop new device constructions which can be utilized in semiconductor applications, and to develop new methods for fabricating semiconductor device constructions.

A relatively common semiconductor device is a memory device, with a dynamic random access memory (DRAM) cell being an exemplary memory device. A DRAM cell comprises a transistor and a memory storage device, with a typical memory storage device being a capacitor. Modern applications for semiconductor devices can utilize vast numbers of DRAM unit cells. It would therefore be desirable to develop new semiconductor device constructions applicable for utilization in DRAM structures, and it would also be desirable to develop new methods for fabricating DRAM structures.

SUMMARY OF THE INVENTION

In one aspect, the invention encompasses a method of forming a semiconductor structure. A semiconductor substrate is provided, with such substrate having a first doped semiconductor region and a second doped semiconductor region over the first doped region. One of the first and second doped semiconductor regions is a p-type region and the other is an n-type region. A trench is formed to extend through the second doped semiconductor region and into the first doped semiconductor. The trench has a sidewall comprising the first and second doped semiconductor regions. A silicide is formed from the trench sidewall. The silicide is within the second doped semiconductor region and not within the first doped semiconductor region. An electrically insulative material is formed within the trench to cover the silicide. The silicide can ultimately be utilized as a bitline in a DRAM array, with the transistor devices of such array being formed over the electrically insulative material which covers the silicide.

In one aspect, the invention encompasses a method of forming a semiconductor memory device. A semiconductor substrate is provided, with such substrate having a semiconductive material upper surface. A trench is formed to extend through the upper surface and into the substrate. A silicide bitline is formed along a sidewall of the trench. A first electrically insulative material is deposited within the trench to cover the bitline. A patterned second electrically insulative material is formed over the bitline and over the first electrically insulative material. The patterned second electrically insulative material has an opening extending therethrough to expose a portion of the semiconductor material upper surface. A vertically-extending pillar of conductively-doped semiconductor material is formed within the opening. The pillar is doped to comprise a pair of first type source/drain regions on vertically opposed sides of a second type channel region. One of the first and second types is p-type and the other is n-type. The pair of source/drain regions is a first source/drain region and a second source/drain region, with the first source/drain region being in electrical connection with the bitline. A gate dielectric is formed around the pillar. At least some of the second electrically insulative material is replaced with a conductive wordline material. The conductive wordline material laterally surrounds the pillar and is separated from the pillar by the gate dielectric. A charge storage device is formed in electrical connection with the second source/drain region, with an exemplary charge storage device being a capacitor. The capacitor, source/drain regions and channel region can be together incorporated within a DRAM unit cell.

In one aspect, the invention encompasses a semiconductor construction. The construction includes a first doped semiconductor region and a second doped semiconductor region over the first doped semiconductor region. One of the first and second doped semiconductor regions is a p-type region and the other is an n-type region. An isolation region extends entirely through the second doped semiconductor region and partially into the first doped semiconductor region. The isolation region is a line having a pair of opposing sidewalls. One of the sidewalls is a first sidewall and the other is a second sidewall. A first silicide line extends along and directly against the first sidewall, with the first silicide line being in direct physical contact with the second doped semiconductor region but not in direct physical contact with the first doped semiconductor region. A second silicide line extends along and directly against the second sidewall. The second silicide line, like the first silicide line, is in direct physical contact with the second doped semiconductor region but not in direct physical contact with the first semiconductor region. In particular aspects, the first and second silicide lines can be utilized as bitlines in a memory array.

In one aspect, the invention encompasses a semiconductor construction having a semiconductor substrate, an isolation region extending into the substrate, and a silicide-containing bitline between the isolation region and the substrate. A pair of spaced wordlines are over the bitline and the isolation region, with one of the wordlines being a first wordline and the other being a second wordline. An electrically insulative line is between the spaced wordlines. A first vertically-extending pillar of conductively-doped semiconductor material extends upwardly from an upper surface of the substrate. The first vertically-extending pillar extends through the first wordline, and comprises a pair of first source/drain regions on vertically opposed sides of a second type channel region. One of the first and second types is p-type and the other is n-type. The pair of source/drain regions are a first source/drain region and a second source/drain region, with the first source/drain region being in electrical contact with the bitline. A second vertically-extending pillar of conductively-doped semiconductor material extends upwardly from the substrate upper surface and through the second wordline. The second vertically-extending pillar comprises a pair of source/drain regions on vertically opposed sides of a second type channel region. The pair of source/drain regions of the second vertically-extending pillar are referred to as a third source/drain region and a fourth source/drain region, with the third source/drain region being in electrical contact with the bitline. A first gate dielectric is around the first vertically extending pillar, and a second gate dielectric is around the second vertically extending pillar. The first and second gate dielectrics separate the first and second vertically-extending pillars, respectively, from the first and second wordlines, respectively. A first charge storage device is in electrical connection with the second source/drain region, and a second charge storage device is in electrical connection with the fourth source/drain region. In particular aspects, the first and second charge storage devices can be capacitors.

BRIEF DESCRIPTION OF THE DRAWINGS

Preferred embodiments of the invention are described below with reference to the following accompanying drawings.

FIGS. 2-4 are a fragmentary top view and a pair of cross-sectional side views of a semiconductor construction at a preliminary processing stage of an exemplary aspect of the present invention. The cross-sectional side views of FIGS. 3 and 4 are along the lines 3-3 and 4-4, respectively, of FIG. 2; the side view of FIG. 4 is along the line 4-4 of FIG. 3, and the side view of FIG. 3 is along the line 3-3 of FIG. 4.

FIGS. 6 and 7 are views along the lines 6-6 and 7-7 of FIG. 5, respectively. FIG. 6 is a view along the line 6-6 of FIG. 7, and FIG. 7 is a view along the line 7-7 of FIG. 6.

FIGS. 9 and 10 are views along the lines 9-9 and 10-10 of FIG. 8, respectively. FIG. 9 is a view along the line 9-9 of FIG. 10, and FIG. 10 is a view along the line 10-10 of FIG. 9.

FIGS. 12 and 13 are views along the lines 12-12 and 13-13, respectively, of FIG. 11. FIG. 12 is a view along the line 12-12 of FIG. 13, and FIG. 13 is a view along the line 13-13 of FIG. 12.

FIGS. 15 and 16 are views along the lines 15-15 and 16-16 of FIG. 14, respectively. FIG. 15 is a view along the line 15-15 of FIG. 16, and FIG. 16 is a view along the line 16-16 of FIG. 15.

FIGS. 18 and 19 are views along the lines 18-18 and 19-19, respectively, of FIG. 17. FIG. 18 is a view along the line 18-18 of FIG. 19, and FIG. 19 is a view along the line 19-19 of FIG. 18.

FIGS. 21 and 22 are views along the lines 21-21 and 22-22, respectively, of FIG. 20. FIG. 21 is a view along the line 21-21 of FIG. 22, and FIG. 22 is a view along the line 22-22 of FIG. 21.

FIGS. 23-25 are views of the fragments of FIGS. 2-4, respectively, shown at a processing stage subsequent to that of FIGS. 20-22. FIGS. 24 and 25 are along the lines 24-24 and 25-25 of FIG. 23, respectively. FIG. 24 is along the line 24-24 of FIG. 25, and FIG. 25 is along the line 25-25 of FIG. 24.

FIGS. 27 and 28 are views along the lines 27-27 and 28-28 of FIGS. 26, respectively. FIG. 27 is a view along the line 27-27 of FIG. 28, and FIG. 28 is a view along the line 28-28 of FIG. 27.

FIGS. 30 and 31 are views along the lines 30-30 and 31-31 of FIG. 29. FIG. 30 is a view along the line 30-30 of FIG. 31, and FIG. 31 is a view along the line 31-31 of FIG. 30.

DETAILED DESCRIPTION OF THE PREFERRED EMBODIMENTS

Figure 1:
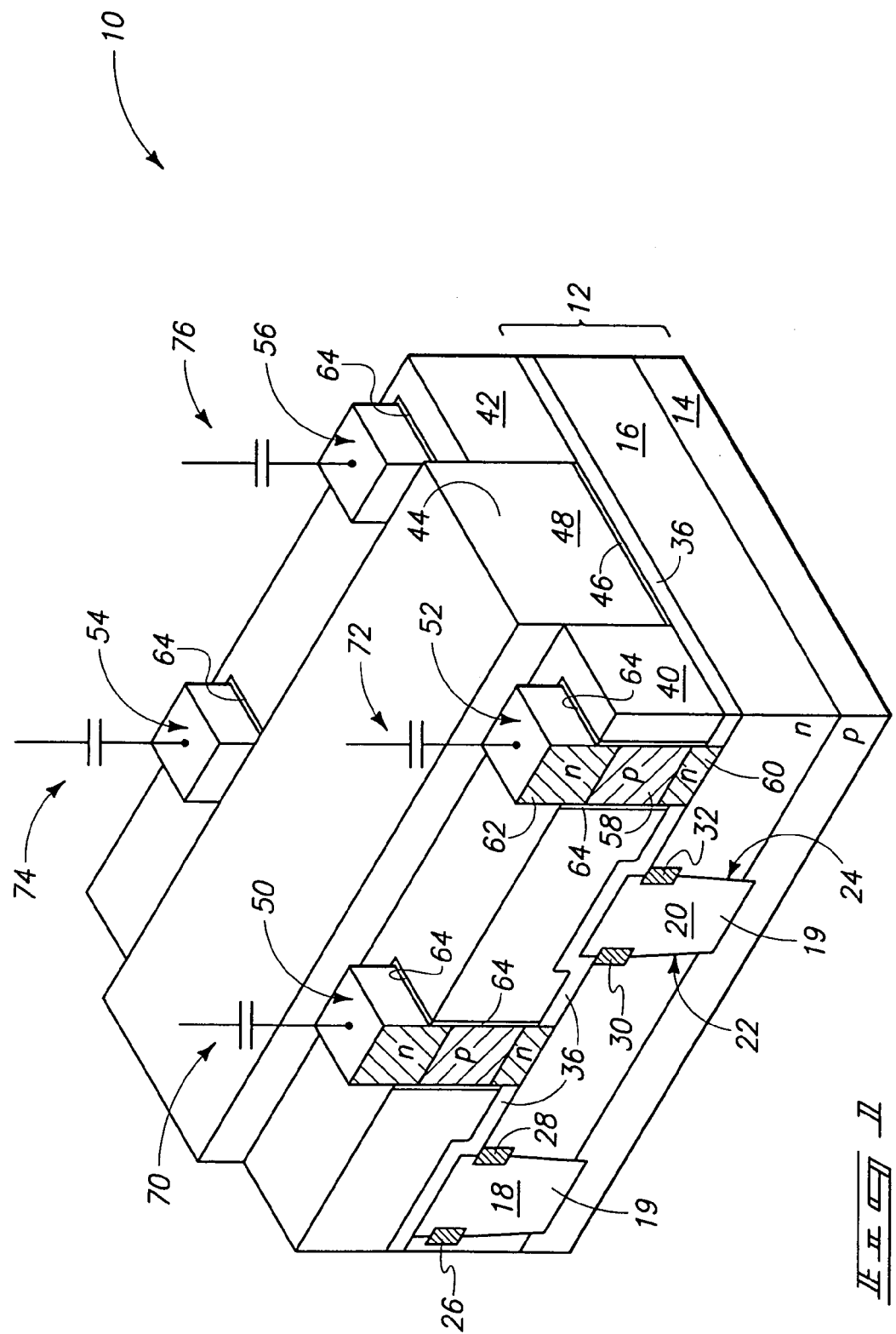
FIG. 1 is a diagrammatic, three-dimensional view of a fragment of a semiconductor wafer construction illustrating a plurality of vertical surround gate transistor structures formed over a plurality of bitlines in accordance with an exemplary aspect of the present invention.

This disclosure of the invention is submitted in furtherance of the constitutional purposes of the U.S. Patent Laws "to promote the progress of science and useful arts" (Article 1, Section 8).

In particular aspects, the invention encompasses dynamic random access memory (DRAM) arrays comprising buried bitlines and vertical surround gate transistors (SGT) extending over the buried bitlines. An exemplary construction 10 is described with reference to FIG. 1.

Construction 10 comprises a base 12 which includes a first doped semiconductor region 14 and a second doped semiconductor region 16 over the first doped semiconductor region. Regions 14 and 16 can comprise, consist essentially of, or consist of appropriately-doped monocrystalline silicon. In the shown aspect of the invention, region 16 comprises n-type doped semiconductor material and region 14 comprises p-type doped semiconductor material, but it is to be understood that the invention encompasses other aspects (not shown) in which the dopant types of regions 14 and 16 are reversed.

One or both of regions 14 and 16 can be referred to as a semiconductor substrate in the discussion that follows. Alternatively, the term "substrate" can be utilized to refer to combinations of structures, such as, for example, the combination of regions 14 and 16 and/or combinations of other structures of construction 10 with one or both of regions 14 and 16. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A pair of isolation regions 18 and 20 are shown extending through the second doped semiconductor region 16 and into the first doped semiconductor region 14. The isolation regions 18 and 20 comprise one or more appropriate electrically insulative materials, and in particular aspects will comprise, consist essentially of, or consist of silicon dioxide. The isolation regions can be referred to as trenched isolation regions, as they extend along trenches within semiconductor materials 14 and 16. The isolation regions can comprise a single homogeneous composition 19 (as shown) or can comprise two or more layers of different insulative materials.

Isolation regions 18 and 20 are typically substantially identical to one another, with the term "substantially identical" indicating that the isolation regions are identical within tolerances of a semiconductor fabrication process utilized to form the regions. Isolation region 20 comprises a pair of sidewalls 22 and 24. Isolation region 18 comprises similar sidewalls, but such are not labeled. Sidewalls 22 and 24 can be referred to as a first sidewall and a second sidewall, respectively, in the discussion that follows. The first and second sidewalls each have a portion along first doped region 14, and another portion along second doped region 16.

A plurality of bitlines 26, 28, 30 and 32 extend within second doped region 16 and along the sidewalls of the isolation regions. For instance, bitlines 30 and 32 are shown extending along the first and second sidewalls 22 and 24, respectively. Bitlines 30 and 32 can be referred to as a first bitline and a second bitline, respectively, in the discussion that follows.

In particular aspects, the bitlines 26, 28, 30 and 32 comprise, consist essentially of, or consist of metal silicide. Accordingly, the bitlines can be referred to as silicide-containing bitlines. The metal silicide of the bitlines can be selected from the group consisting of, for example, cobalt silicide, nickel silicide, tantalum silicide, tungsten silicide, titanium silicide, and mixtures thereof.

The bitlines 26, 28, 30 and 32 extend along and directly against the sidewalls of the isolation regions, and also are in direct physical contact with the second doped semiconductor region 16. The terms "directly against" and "direct physical contact" are utilized to indicate that features touch one another. The bitlines 26, 28, 30 and 32 are not in direct physical contact with the first doped semiconductor region 14.

An electrically insulative material 36 extends over the isolation regions 18 and 20, and also over bitlines 26, 28, 30 and 32. An exemplary elevational thickness for layer 36 is about 500 Å. Electrically insulative material 36 can comprise any suitable material, and in particular aspects will comprise, consist essentially of, or consist of silicon dioxide. Accordingly, insulative material 36 and the insulative material 19 within isolation regions 18 and 20 can have the same composition as one another. In some aspects, isolation regions 18 and 20 can be considered to comprise only the insulative material 19 trenched within semiconductor regions 14 and 16, and in other aspects the isolation regions can be considered to comprise materials 19 and 36 in combination. If the isolation regions are considered to comprise materials 19 and 36 in combination, the bitlines 26, 28, 30 and 32 can be considered to be entirely contained between the isolation regions and the second doped semiconductor region 16 in the shown aspect of the invention.

A spaced pair of wordlines 40 and 42 is over insulative material 36. An exemplary elevational thickness of wordlines 40 and 42 is from about 1000 Å to about 4000 Å. The wordlines extend over the bitlines 26, 28, 30 and 32, and also over the isolation regions 18 and 20. Wordlines 40 and 42 can be referred to as a first wordline and a second wordline, respectively. The wordlines can comprise, consist essentially of, or consist of conductively-doped silicon, and in particular aspects will comprise, consist essentially, or consist of conductively-doped polycrystalline and/or amorphous silicon. It is to be understood, however, that the wordlines can comprise any suitable conductive material. In some aspects, the wordlines will comprise metal and/or metal compounds, either alone, or in combination with conductively-doped silicon. If the wordlines comprise conductively-doped silicon, the silicon can be either p-type or n-type, with the conductivity type being chosen according to the suitability for particular applications of the invention.

The wordlines are shown formed directly against insulative material 36. Accordingly, in the shown aspect of the invention the only material separating trenched material 19 from wordlines 40 and 42 is the dielectric material 36.

An electrically insulative line 44 extends between wordlines 40 and 42, and electrically isolates the wordlines from one another. The line 44 extends over the isolation regions and bitlines.

Line 44 comprises a thin lower portion 46 and a thick upper portion 48. An exemplary elevational thickness for layer 46 is about 100 Å, and an exemplary elevational thickness for portion 48 is from about 1,000 Å to about 4,000 Å, with about 2,500 Å being typical. In particular aspects of the invention, lower portion 46 can be a high-k dielectric material. The term high-k is used to refer to materials which have a dielectric constant greater than that of silicon dioxide. Exemplary high-k materials suitable for portion 46 are materials comprising one or both of aluminum oxide and hafnium oxide. Line 44 can be described as comprising both of materials 46 and 48. In other aspects, the line can be considered to consist of the material 48 and to not include the material 46. In aspects in which the line is considered to not comprise material 46, the line can be considered to be separated from the isolation region by the dielectric materials 36 and 46.

Material 48 can be a material which is selectively etchable relative to material 46, with exemplary materials being doped or undoped silicon oxides in aspects in which material 46 consists essentially of or consists of one or both of aluminum oxide and hafnium oxide. Material 48 can, for instance, comprise, consist essentially of, or consist of silicon dioxide or borophosphosilicate glass (BPSG). An advantage of having material 48 selectively etchable relative to material 46 occurs during fabrication of construction 10, and such advantage will be discussed in more detail in discussing methodological aspects of the invention with reference to FIGS. 2-31 below.

In some aspects of the invention, it can be advantageous for material 36 to be a low-k material (with the term "low-k" being used to refer to materials which have a dielectric constant less than or equal to that of silicon dioxide), since material 36 electrically isolates the wordlines 40 and 42 from the bitlines 26, 28, 30 and 32. Specifically, if high-k dielectric materials are utilized for material 36, there may be a problem of parasitic capacitance between the wordlines and the bitlines. Thus, in some aspects, the high-k material 46 will be directly against a low-k dielectric material (specifically, dielectric material 36).

Vertically-extending pillars 50, 52, 54 and 56 extend upwardly through the first and second wordlines. Specifically, pillars 50 and 52 extend upwardly through first wordline 40, and pillars 54 and 56 extend upwardly through second wordline 42. The pillars comprise conductively-doped semiconductor material. For instance, pillar 52 is shown to comprise a p-type doped central region vertically sandwiched between a pair of n-type doped regions. The p-type doped region can correspond to a channel region of a transistor device, and the n-type doped regions can correspond to source/drain regions of the device. The middle channel region of pillar 52 is labeled as 58, and the source/drain regions are labeled as 62 and 60. Source/drain regions 60 and 62 can be referred to as first and second source/drain regions, respectively. Although the shown dopant types of the channel region and source/drain regions are p-type and n-type, respectively, it is to be understood that the dopant types can be reversed in other aspects of the invention (not shown).

In some aspects, base 12 can be considered a semiconductor substrate having an upper surface corresponding to the surface of first doped region 16. In such aspects, vertically-extending pillars 50, 52, 54 and 56 can be considered to extend upwardly from the upper surface of the semiconductor substrate.

For purposes of the discussion that follows, pillar 52 can be referred to as a first vertically-extending pillar associated with first wordline 40, and pillar 56 can be referred to as a second vertically-extending pillar associated with wordline 42. The vertically-extending pillar 56 would comprise the same dopant configuration as shown for pillar 52, although the dopant configuration of pillar 56 is not visible in the view of FIG. 1.

The semiconductor material of the vertically-extending pillars 52 can comprise any suitable material, and in particular aspects will comprise monocrystalline silicon. In particular aspects, first doped region 16 can comprise monocrystalline silicon, and the vertically-extending pillars can be formed by epitaxial growth from first doped region 16. In such aspects, the vertically-extending pillars can be considered to comprise monocrystalline extensions of the monocrystalline semiconductor material of first doped region 16.

A gate dielectric material 64 extends around the vertically-extending pillars, and electrically isolates the vertically-extending pillars from the wordlines. Gate dielectric 64 can comprise any suitable material, or combination of materials. In particular aspects, gate dielectric 64 will comprise, consist essentially of, or consist of silicon dioxide.

The relative heights of lines 48, vertically-extending pillars 50, 52, 54, and 56, and wordlines 40 and 42 are shown approximately accurately in FIG. 1. Specifically, the vertically-extending pillars would be formed to about the same height as the line 44, and the wordlines 40 and 42 would extend across a lower region of the second source/drain region 62, but would not extend to the top of the vertically-extending pillars. Typically, a wordline (such as, for example, wordline 40) would overlap the upper source/drain region (such as source/drain region 62) from about 200 Å to about 300 Å, and an uppermost surface of the wordline will thus be from about 200 Å to about 500 Å below uppermost surfaces of the vertically-extending pillar.

Each of the lower source/drain regions of the vertically-extending pillars (such as, for example, the source/drain region 60) is electrically connected with a pair of bitlines (for instance, the bitlines 28 and 30 connect with a bottom source/drain region of pillar 50; the second bitline connected with source/drain region 60 is not shown in the view of FIG. 1). The upper source/drain regions (such as, for example, the region 62) would be connected with appropriate charge-storage devices for forming a DRAM construction. In the shown embodiment, the upper source/drain regions are connected with capacitor constructions 70, 72, 74 and 76. The capacitor constructions are shown schematically, and can comprise any suitable construction.

Although not shown in the diagram of FIG. 1, there would typically be one or more insulative materials formed over the wordlines 40 and 42, and over the uppermost surfaces of the vertically-extending pillars. Openings would then be formed through the insulative materials to form the capacitors and more insulative layers would be added for electrical isolation. A suitable electrically insulative structure for forming over wordlines 40 and 42, and over the exposed surfaces of the vertically-extended pillars, is a first layer of silicon dioxide formed from tetraethylorthosilicate (TEOS), and a second thicker layer comprising, for example, BPSG. The silicon dioxide formed from TEOS can prevent dopant migration between the source/drain regions and other materials formed over the silicon dioxide.

The wordlines 40 and 42 can be considered to comprise transistor gate structures which gatedly connect the source/drain regions of the vertically-extending pillars through the channel regions. For instance, wordline 40 can be considered to comprise a gate which gatedly connects source/drain regions 60 and 62 to one another through channel region 58. In particular aspects, the transistor gate structures, capacitor structures, source/drain regions and channel regions can be considered to comprise DRAM unit cells. For instance, the capacitor 72 together with diffusion regions 58, 60 and 62, and a transistor gate comprised by wordline 40, can be considered to form a DRAM unit cell. The DRAM unit cells can be incorporated into a DRAM array, and such array can be incorporated into an electronic device.

The DRAM unit cells can correspond to $4F^2$ constructions in some aspects of the invention. In particular aspects of the invention, at least the portion of a DRAM unit cell comprising a transistor gate from a wordline (such as, for example, the wordline 40), together with the source/drain and channel regions of the vertically-extending pillar surrounded by the wordline, will correspond to a $4F^2$ construction. In other words, at least the portion of the DRAM unit cell exclusive of the capacitor will correspond to a $4F^2$ construction. The capacitor may also be included within the $4F^2$ construction, or in other aspects the capacitor may comprise a configuration such that the capacitor does not fit within a $4F^2$ construction.

Although the invention is described in FIG. 1 with reference to a DRAM construction, it is to be understood that the invention can have application to other constructions, including, for example, constructions associated with display applications, micro-electro-mechanical systems (MEMS) matrix applications, etc.

Exemplary methodology for forming the construction of FIG. 1 is described with reference to FIGS. 2-31. Similar numbering will be used to describe FIGS. 2-31 as was used in describing FIG. 1, where appropriate.

Referring first to FIGS. 2-4, such illustrate a semiconductor structure 200 in top view (FIG. 2), and a pair of cross-sectional views (FIGS. 3 and 4). The construction 200 comprises the first doped semiconductor region 14 and second doped semiconductor region 16 discussed above with reference to FIG. 1. Second doped semiconductor material 16 has an uppermost surface 17. A pair of patterned masking materials 202 and 204 are formed over the uppermost surface 17. Materials 202 and 204 can comprise, for example, silicon dioxide and silicon nitride, respectively.

Patterned materials 202 and 204 have a pair of openings 206 and 208 extending therethrough, and construction 200 is shown after it has been subjected to appropriate processing to extend the openings 206 and 208 entirely through second doped semiconductor region 16 and partially into first doped semiconductor region 14.

Openings 206 and 208 correspond to trenches. The trenches 206 and 208 have sidewalls 210 and 212, respectively, with such sidewalls comprising a portion of the first doped semiconductor region 14 and a portion of the second doped semiconductor region 16.

An electrically insulative material 214 is formed within the bottom of trenches 206 and 208. Electrically insulative material 214 can be formed in the shown configuration by depositing a material to extend over layer 204 and within the trenches, and subsequently etching back the material to leave the remaining material 214 as shown. Insulative material 214 can comprise any suitable material or combination of materials. In particular aspects, material 214 will comprise, consist essentially of, or consist of silicon dioxide. Electrically insulative material 214 can be referred to as a first electrically insulative material, and the trenches having material 214 therein can be referred to as partially-filled trenches. In the shown aspect of the invention, the material 214 is within the partially-filled trenches to above an elevational level of an uppermost portion of the first doped semiconductor region 14.

Figure 5:
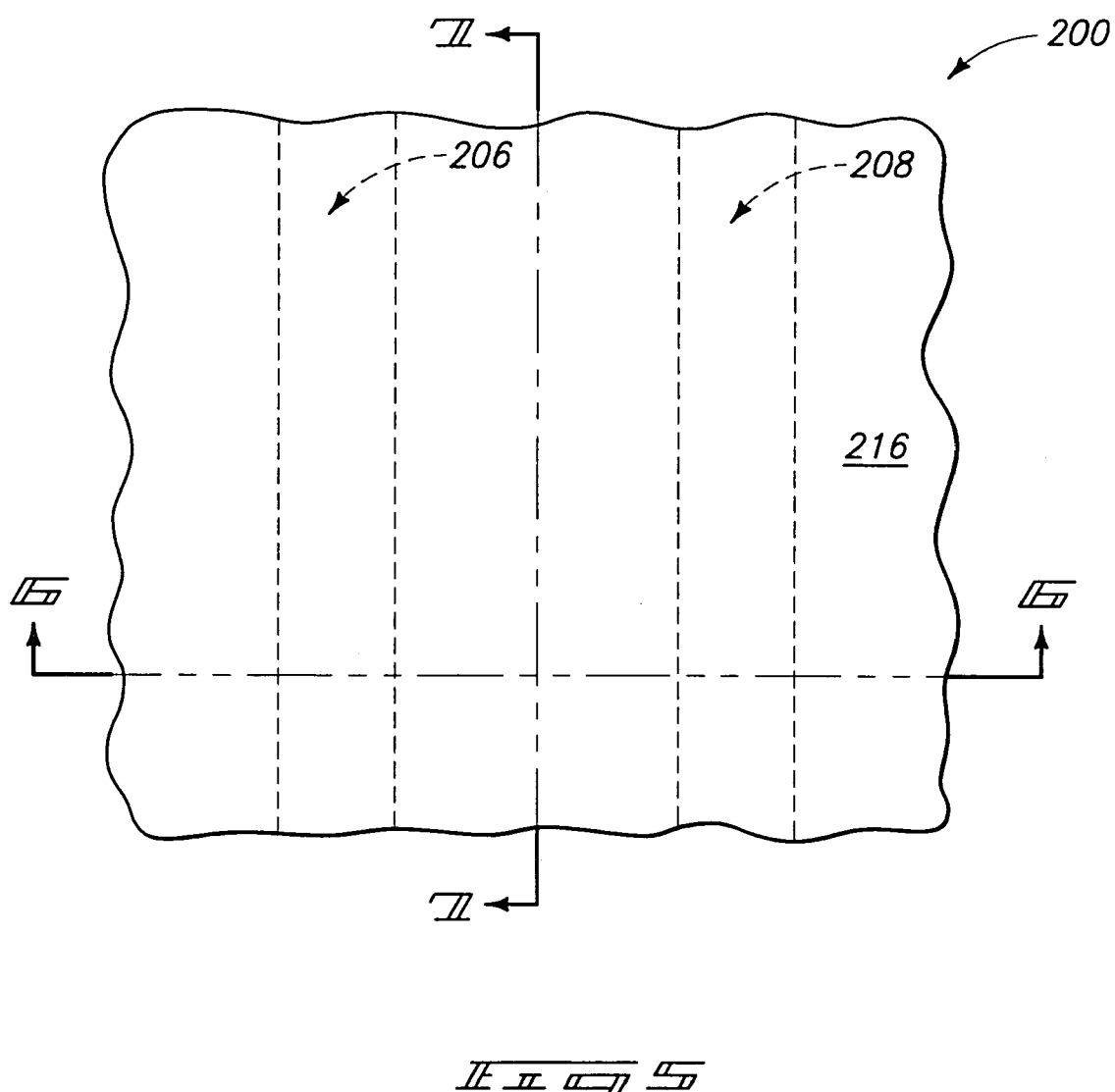
FIGS. 5-7 are views of the FIG. 2-4 wafer fragments, respectively, shown at a processing stage subsequent to that of FIGS. 2-4.
Figure 6:
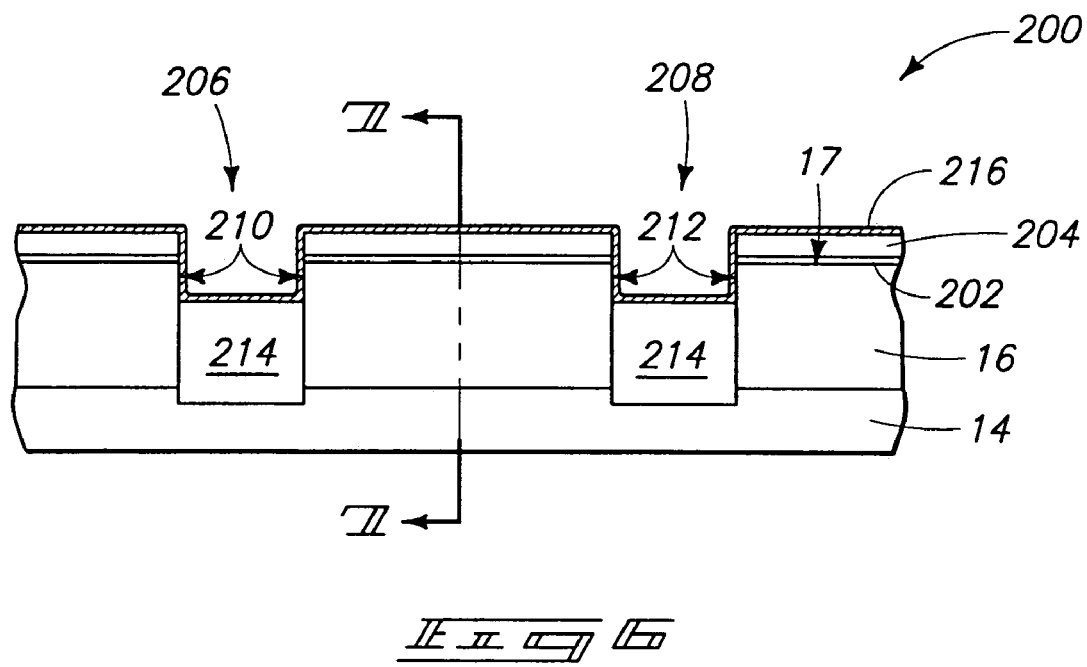
Figure 7:
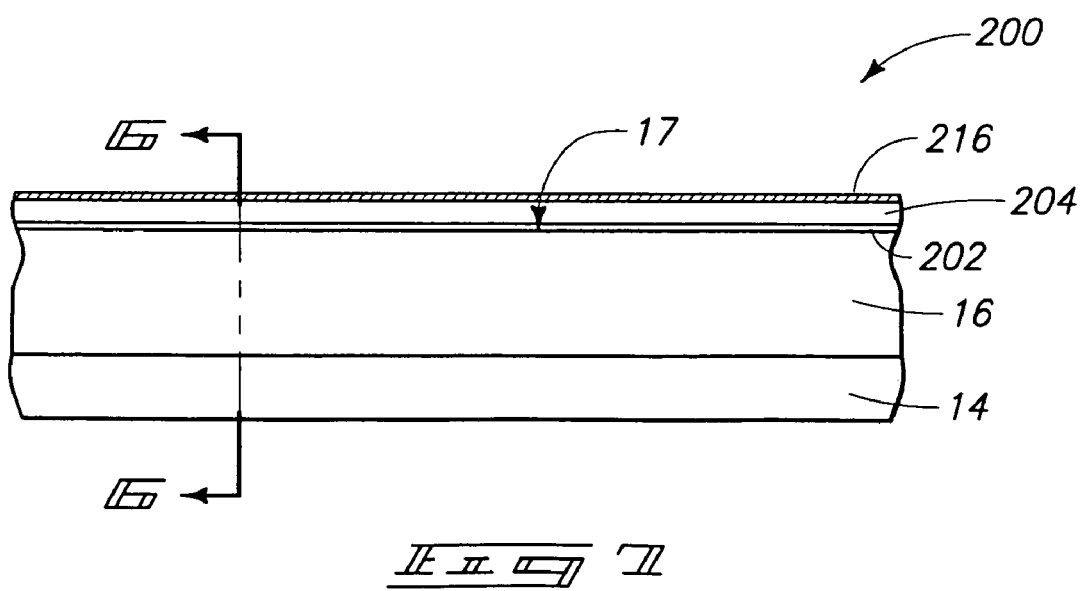

Referring next to FIGS. 5-7, a metal-containing layer 216 is formed over layer 204 and within trenches 206 and 208. The trenches 206 and 208 are shown in dashed view in FIG. 5 to indicate that the trenches are beneath the metal-containing layer 216. Metal-containing layer can comprise any suitable metal, and in particular aspects will comprise, consist essentially of, or consist of one or more of cobalt, nickel, tantalum, tungsten and titanium. Metal-containing material 216 is formed along the sidewalls 210 and 212, and specifically is formed directly against the second doped semiconductor material 16 of such sidewalls.

Figure 8:
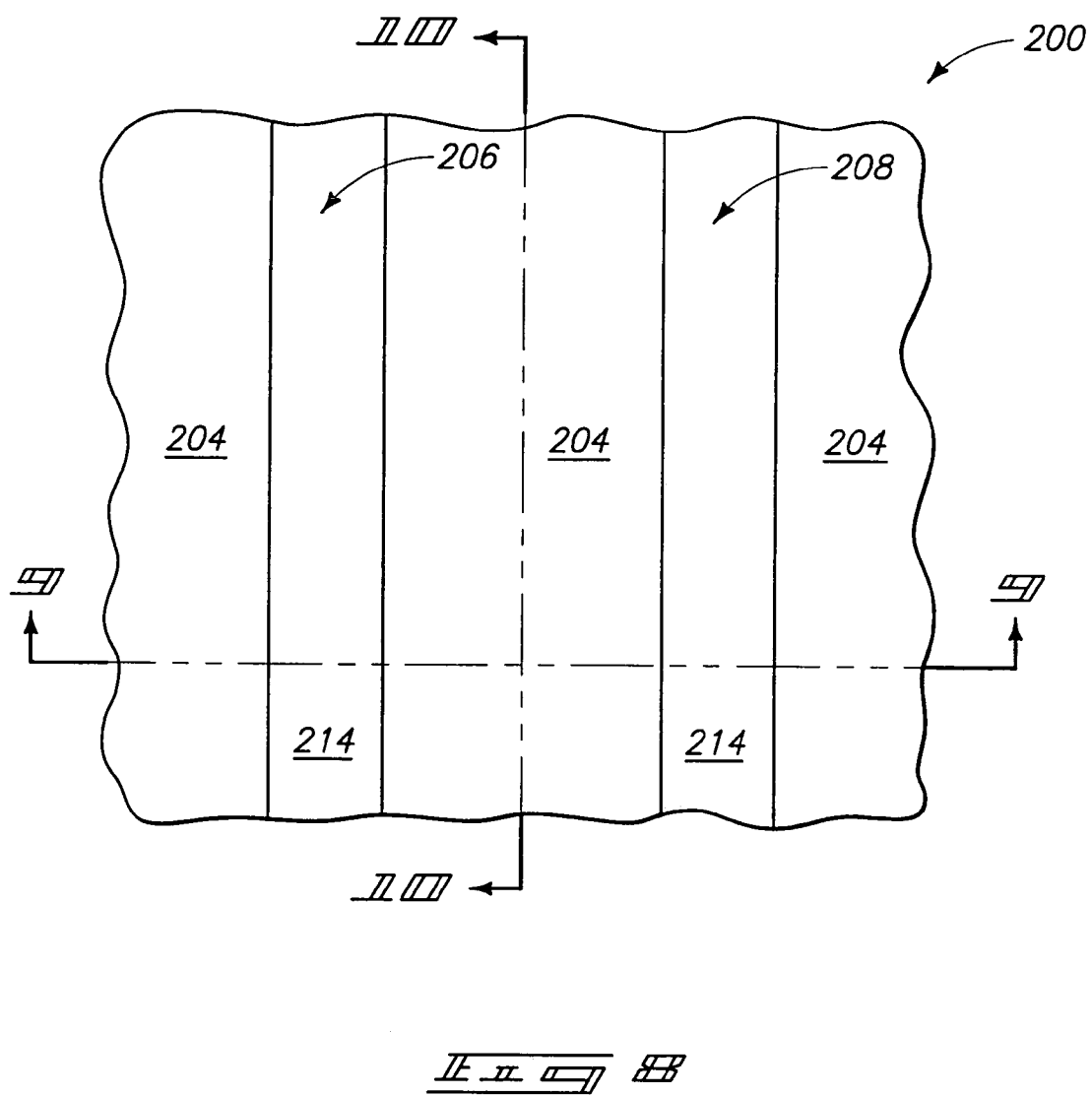
FIGS. 8-10 are views of the fragments of FIGS. 2-4, respectively, shown at a processing stage subsequent to that of FIGS. 5-7.
Figure 9:
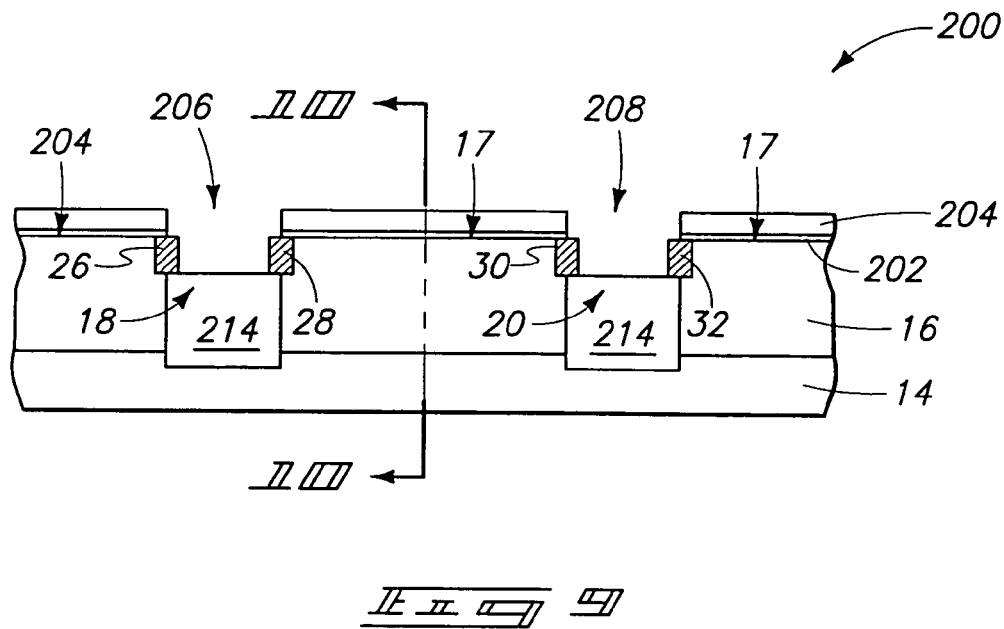
Figure 10:
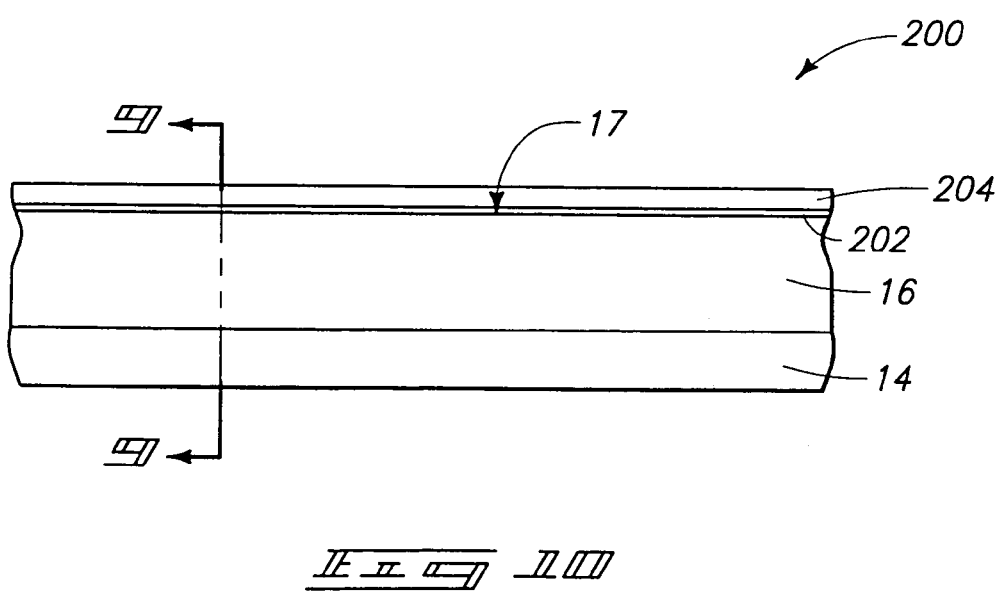

Referring next to FIGS. 8-10, portions of the metal-containing layer 216 (FIGS. 5-7) adjacent second doped semiconductor region 16 are converted to silicide lines 26, 28, 30 and 32, and the remainder of the metal-containing layer is removed. The silicide lines are not shown in the top view of FIG. 8 to simplify the drawing.

The metal of the metal-containing layer can be converted to the silicide lines by reacting the metal with semiconductor material from region 16 under appropriate conditions. For instance, if the metal-containing layer comprises cobalt, the cobalt can be reacted with silicon from region 16 at a temperature of about 800° C. or lower; and if the metal-containing layer comprises nickel, the nickel can be reacted with silicon from layer 16 at a temperature of about 700° C. or lower. It can be advantageous to utilize cobalt or nickel for forming the silicide, in that the formation of the silicide can occur at relatively low temperatures which can avoid detrimental effects on other circuitry (not shown) that may be associated with a wafer supporting regions 14 and 16.

Even though it may be advantageous to use metals that can form silicides at relatively low temperatures, it is to be understood that other metals can also be utilized for forming silicide. For instance, the silicide can also be formed from tantalum or tungsten. In some aspects of the invention, it can be advantageous if the silicide lines comprise silicide which is resistant to high temperatures utilized in subsequent processing stages, such as, for example, temperatures utilized for epitaxial growth of silicon. In such aspects, it can be advantageous if the silicide comprises, consists essentially of, or consists of, for example, one or both of tungsten silicide and tantalum silicide.

Silicide lines 26, 28, 30 and 32 can be referred to as salicide lines (self-aligned silicide) in that the lines are aligned relative to sidewalls of the trenches 206 and 208.

Figure 11:
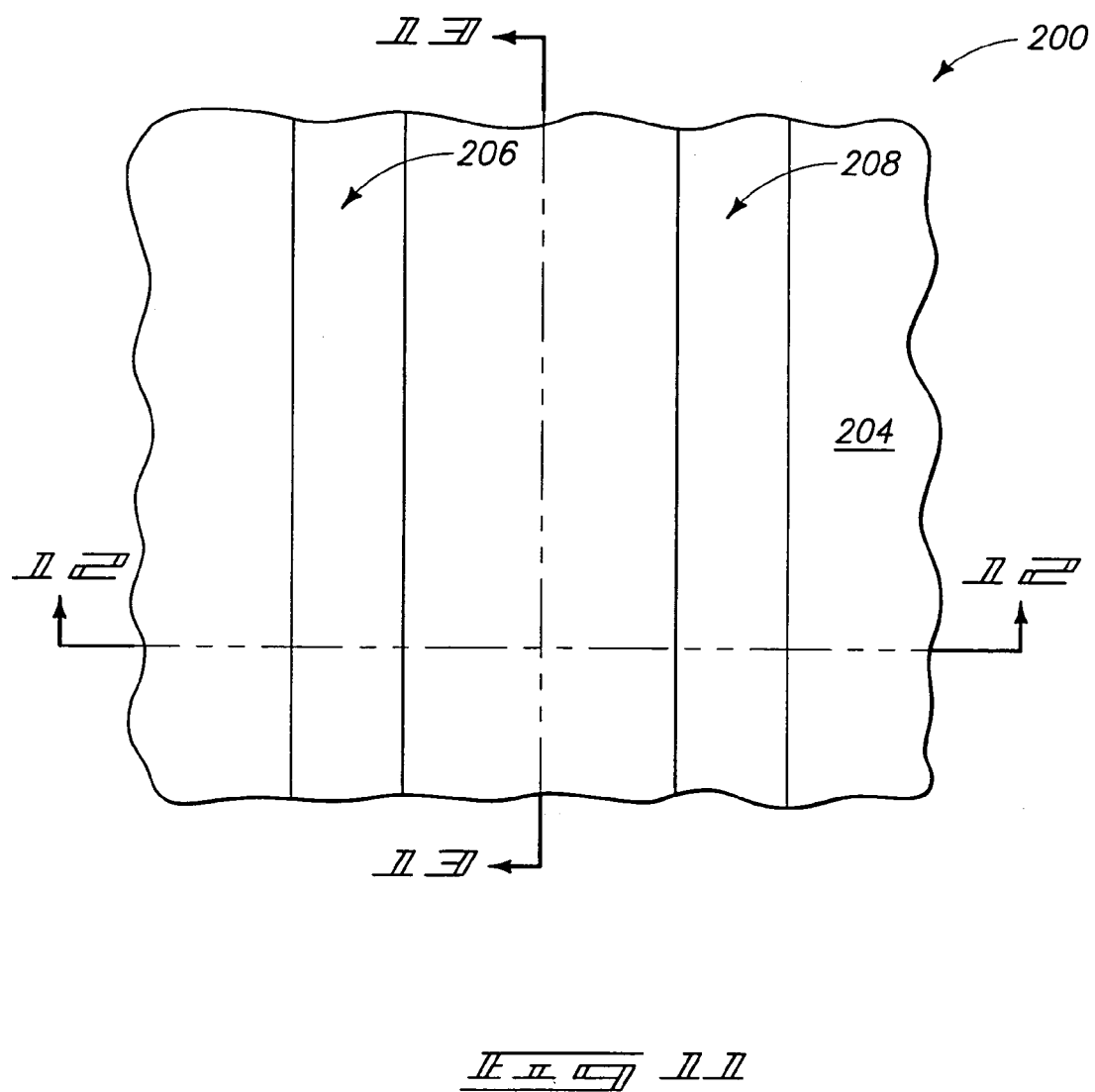
FIGS. 11-13 are views of the fragments of FIGS. 2-4, respectively, shown at a processing stage subsequent to that of FIGS. 8-10.
Figure 12:
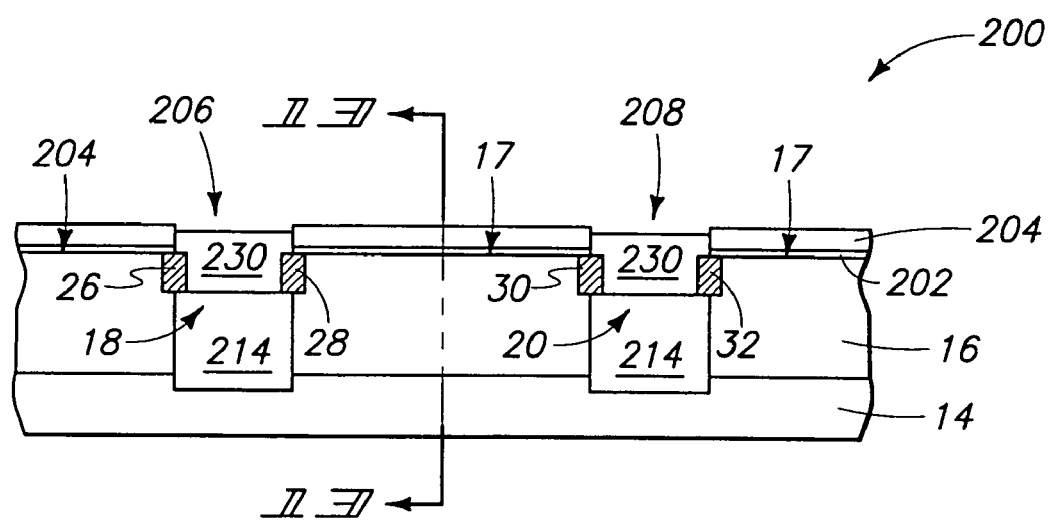
Figure 13:
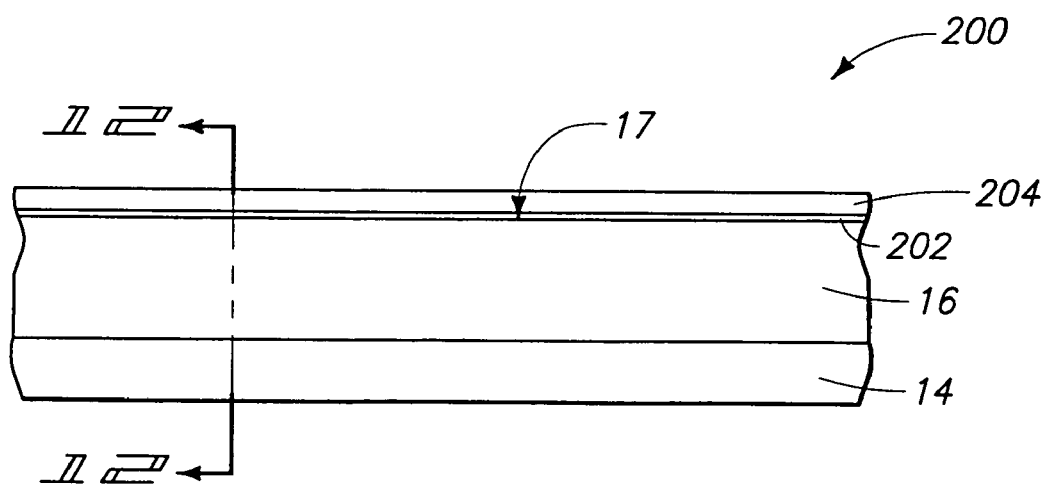

Referring next to FIGS. 11-13, a second insulative material 230 is formed within trenches 206 and 208. The second insulative material 230 covers the first insulative material 214, and also covers the silicide lines 26, 28, 30 and 32. The first and second insulative materials 214 and 230 can be the same as one another, or can differ in composition from one another. In particular aspects of the invention, both materials 214 and 230 will be the same as one another, and will consist essentially of, or consist of silicon dioxide.

Materials 214 and 230 can be considered to together form the trenched insulative material 19 described previously with reference to FIG. 1. Accordingly, regions 214 and 230 can together correspond to the trenched isolation regions 18 and 20 of FIG. 1. The trenched isolation regions 18 and 20 of FIG. 12 have a different cross-sectional shape than those of FIG. 1. Specifically, the sidewalls of the trenched isolation regions of FIG. 1 are less vertical than those of FIG. 12. The difference in the shapes of the isolation regions of FIGS. 1 and 12 illustrate minor variations that can occur in various aspects of the invention. It is to be understood that the isolation regions can have any suitable shape, including, the shape of FIG. 12, the shape of FIG. 1, or a different shape depending on the processing utilized to form the trenches within which the isolation regions are ultimately constructed.

Figure 14:
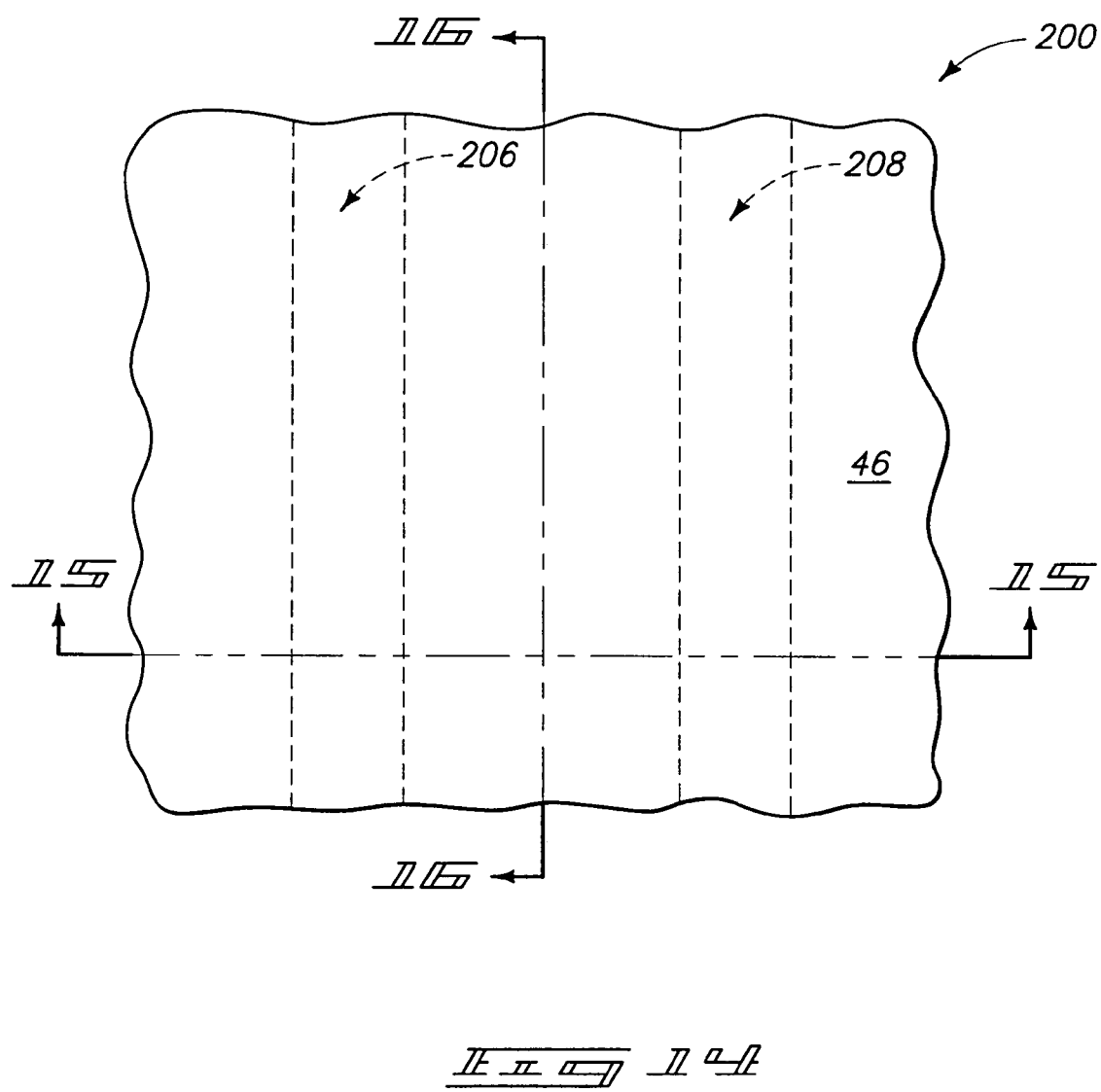
FIGS. 14-16 are views of the fragments of FIGS. 2-4, respectively, shown at a processing stage subsequent to that of FIGS. 10-12.
Figure 15:
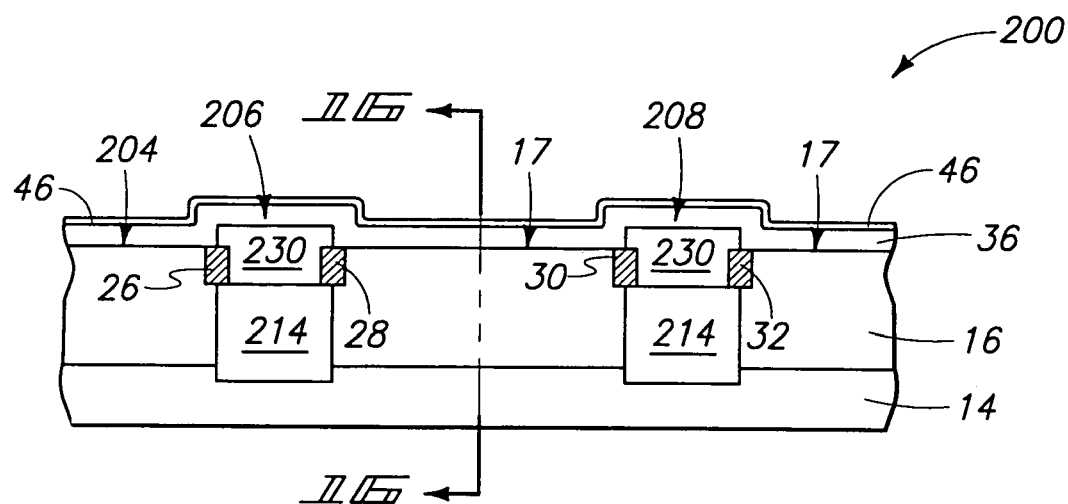
Figure 16:
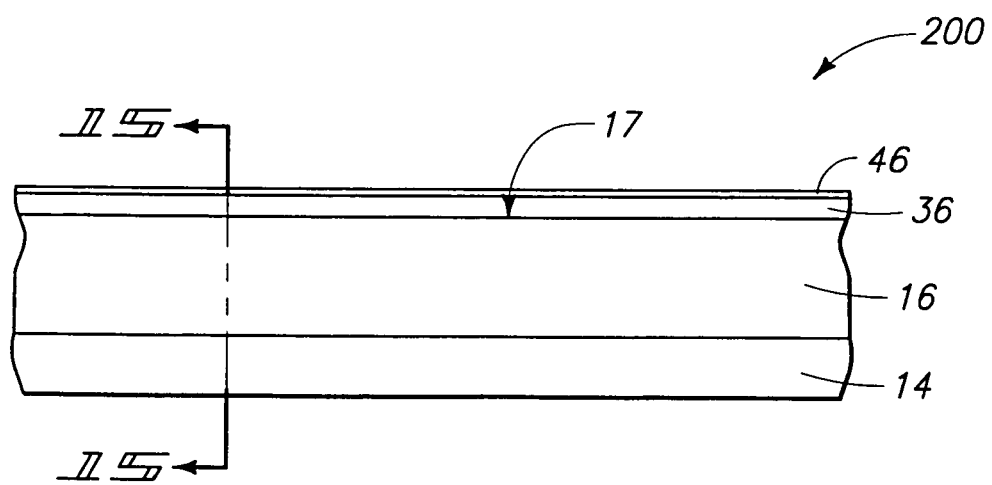

Referring next to FIGS. 14-16, the layers 202 and 204 (FIGS. 2-13) are removed, and subsequently layers 36 and 46 are formed over trenched regions 206 and 208, as well as over the upper surface 17 of second doped semiconductor material 16. As discussed previously, material 36 can comprise a low-k material, such as, for example, silicon dioxide, and in particular aspects material 36 will comprise, consist essentially of, or consist of silicon dioxide. As was also discussed above, layer 46 can comprise a high-k material, and in particular aspects will comprise, consist essentially of, or consist of one or both of aluminum oxide and hafnium oxide. In some aspects, the dielectric constant of material 46 is less pertinent than the etching characteristics of the material. Specifically, material 46 is preferably a material which can be selectively etched relative to material 36, and also preferably a material to which the overlying material 48 (FIG. 1) of the insulative line 44 (FIG. 1) can be selectively etched.

In some aspects of the invention, material 46 can be referred to as an etch stop. The term "etch stop" is utilized to indicate that an etch performed over material 46 substantially ceases upon reaching material 46, which can include aspects in which the etch fully stops upon reaching 46, and also includes aspects in which the etch slows upon reaching material 46 without coming to a complete stop. In the shown configuration, material 46 is directly against material 36.

Figure 17:
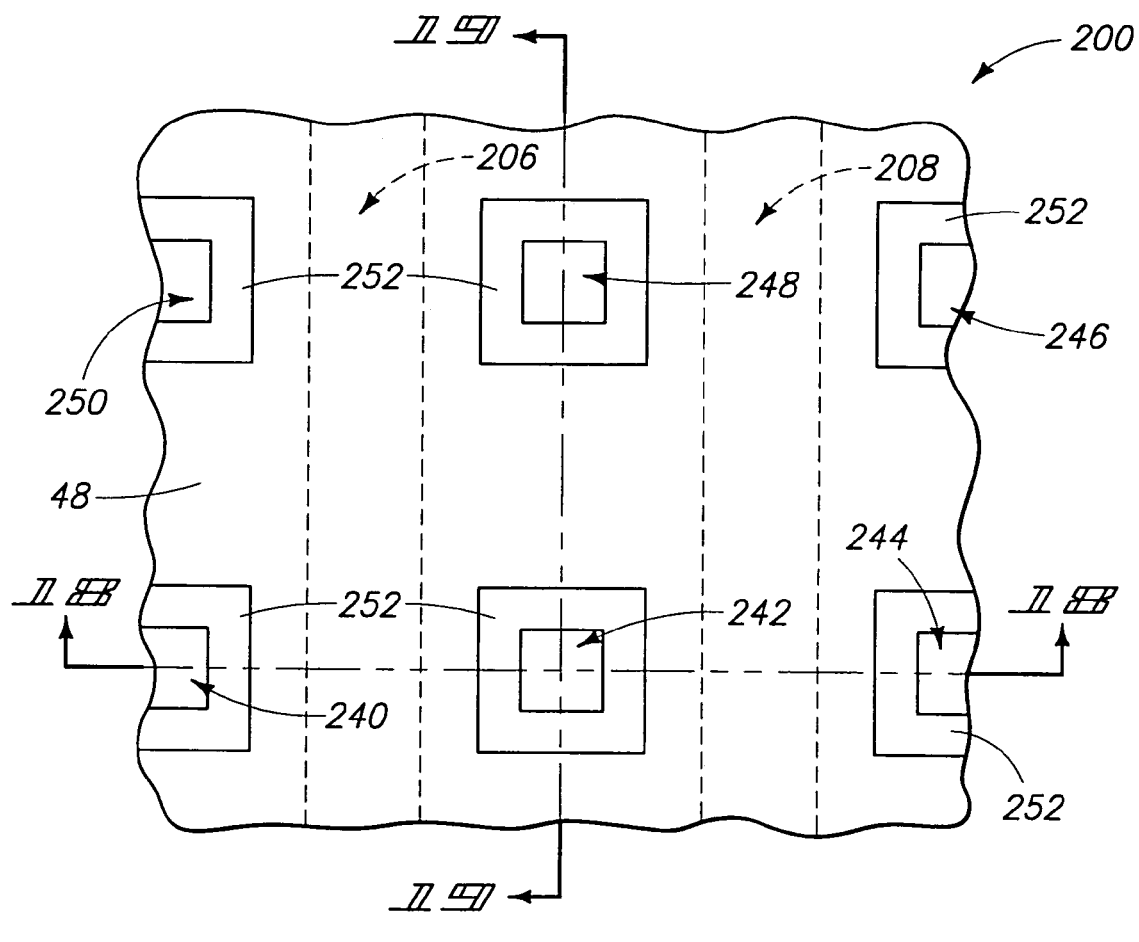
FIGS. 17-19 are views of the fragments of FIGS. 2-4, respectively, shown at a processing stage subsequent to that of FIGS. 14-16.
Figure 18:
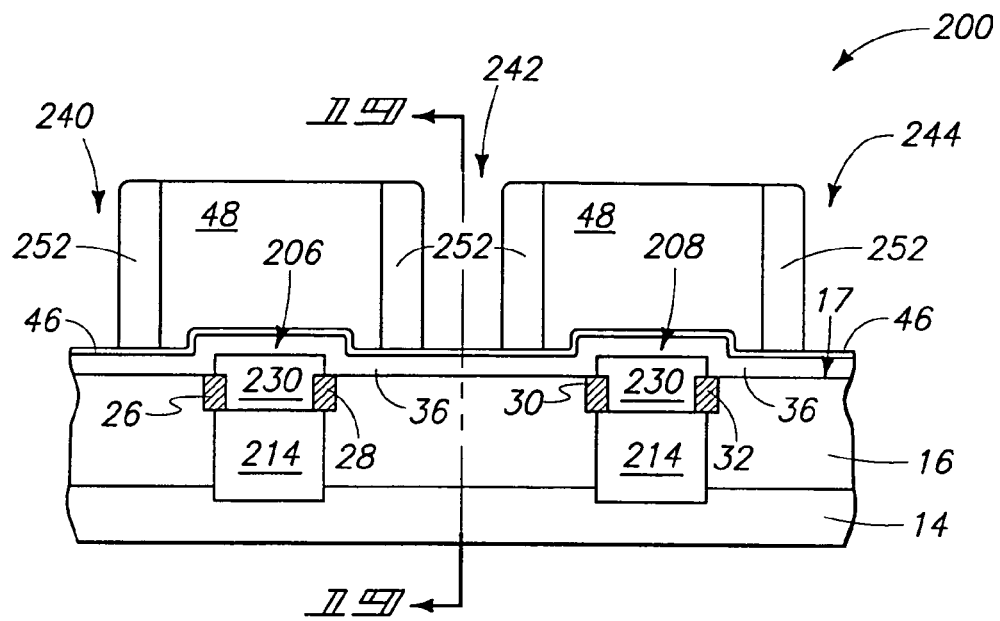
Figure 19:
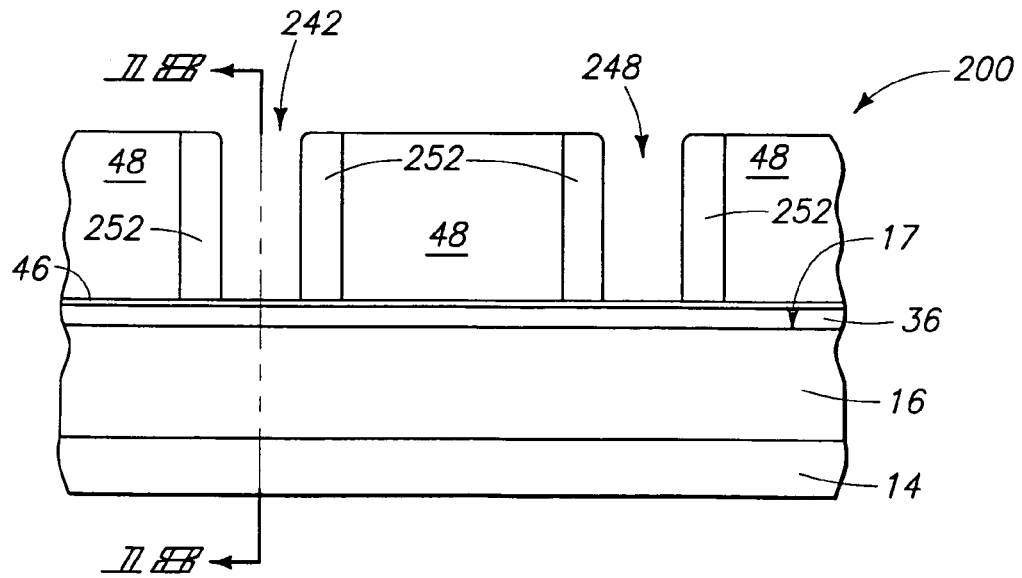

Referring next to FIGS. 17-19, an electrically insulative material 48 is formed over layer 46 and patterned to have a plurality of openings 240, 242, 244, 246, 248 and 250 extending therethrough. Insulative material 48 can be referred to as a patterned insulative material in the discussion that follows. Insulative material 48 can comprise, consist essentially of, or consist of silicon dioxide or doped silicon dioxide. Material 48 can be formed into the shown pattern by initially forming a continuous layer of material 48 over layer 46, planarizing the layer of material 48, and then utilizing photolithographic processing to transfer the desired pattern into material 48 with, for example, a photoresist mask. The photoresist mask can subsequently be removed to leave the patterned material 48 remaining over layer 46.

After formation of patterned material 48, spacers 252 are formed within the openings 240, 242, 244, 246, 248 and 250. Spacers 252 can comprise any suitable material. In exemplary processes, spacers 252 can comprise, consist essentially of, or consist of silicon nitride. The spacers 252 can be formed by forming a layer of silicon nitride uniformly over patterned material 48 and within the openings extending through the patterned material, and subsequently anisotropically etching the layer. Spacers 252 narrow the openings 240, 242, 244, 246, 248 and 250. Regions of layer 46 are exposed within the narrowed openings.

Figure 20:
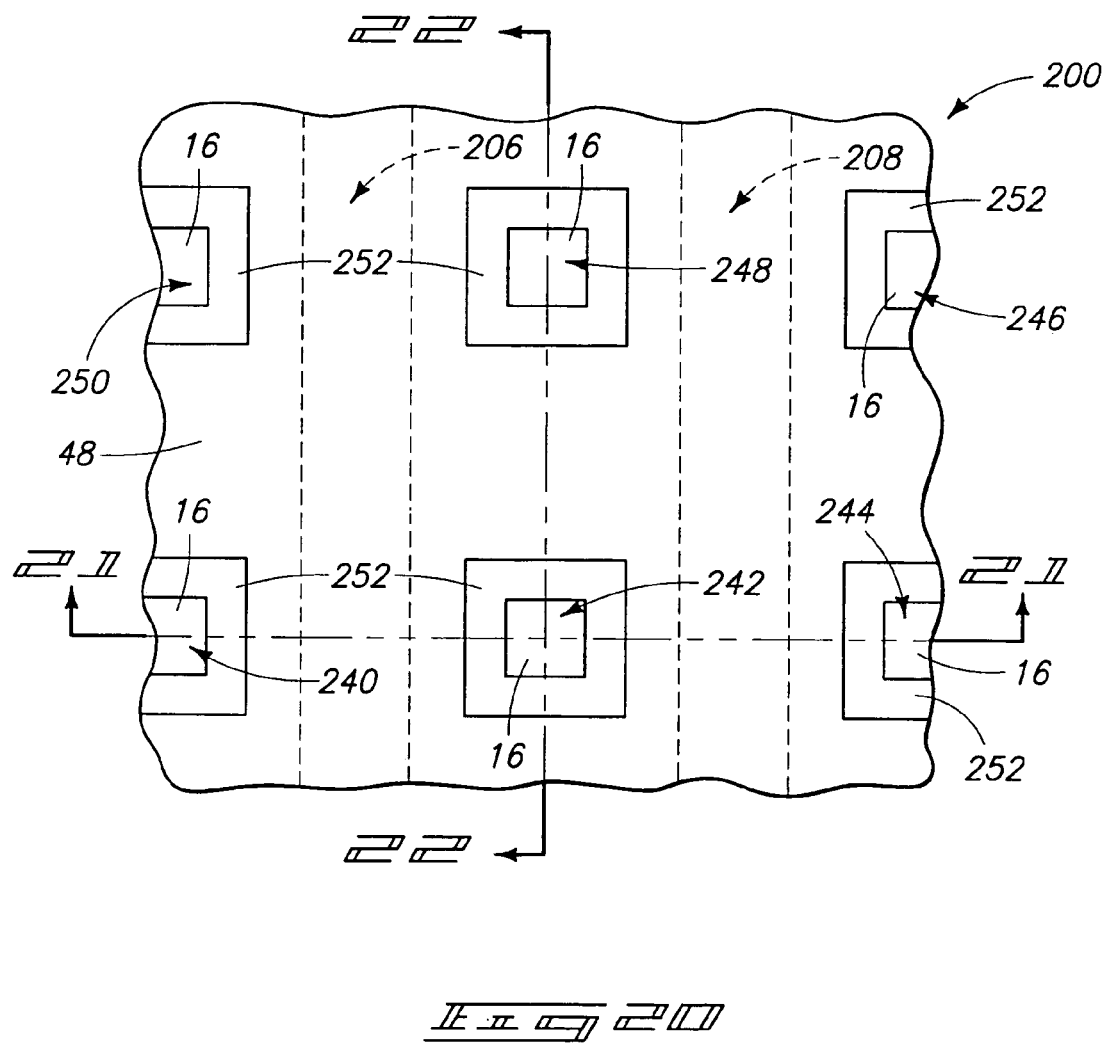
FIGS. 20-22 are views of the fragments of FIGS. 2-4, respectively, shown at a processing stage subsequent to that of FIGS. 17-19.
Figure 21:
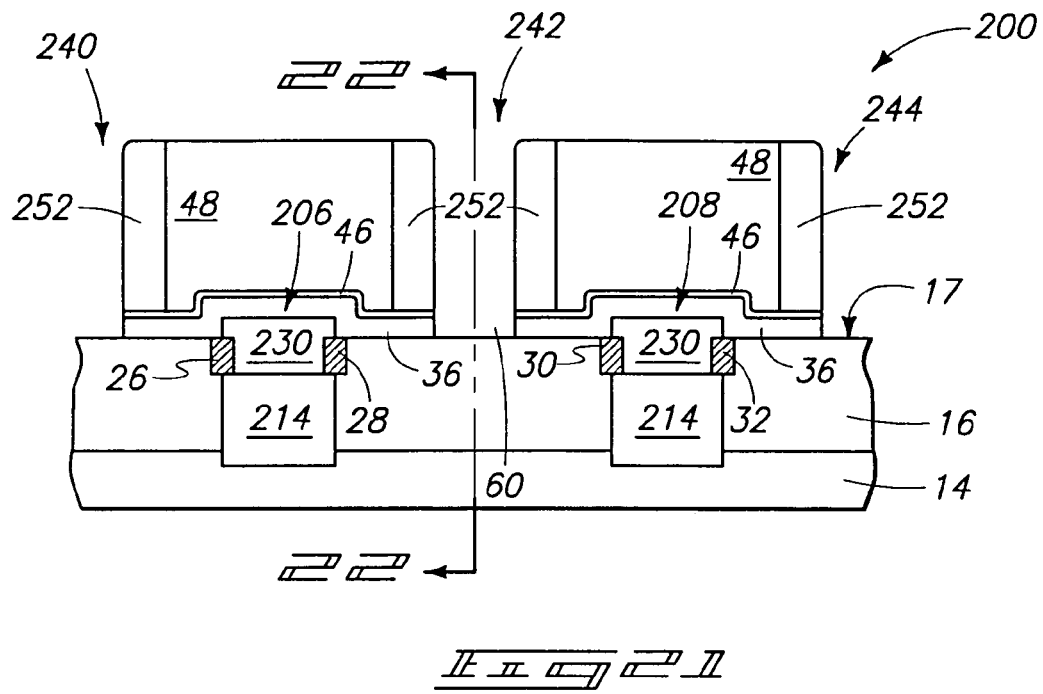
Figure 22:
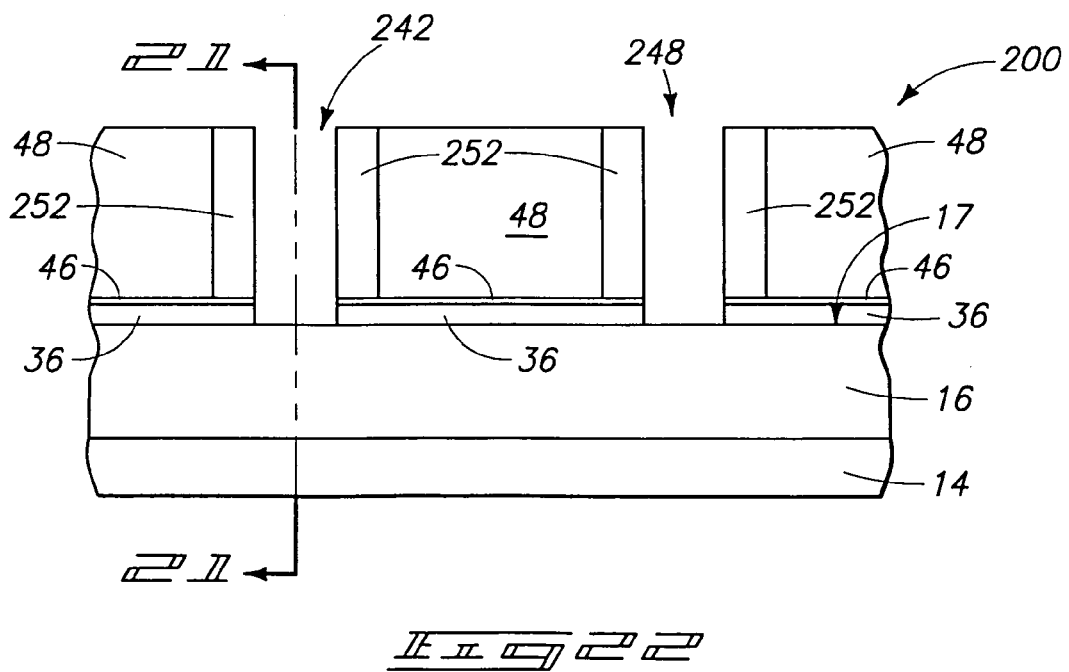

Referring next to FIGS. 20-22, the narrowed openings 240, 242, 244, 246, 248 and 250 are extended through materials 36 and 46 to expose the upper surface 17 of the second doped semiconductor region 16. The etch through material 46 can comprising, for example, a selective wet etch or a sputter etch (punch).

Figure 23:
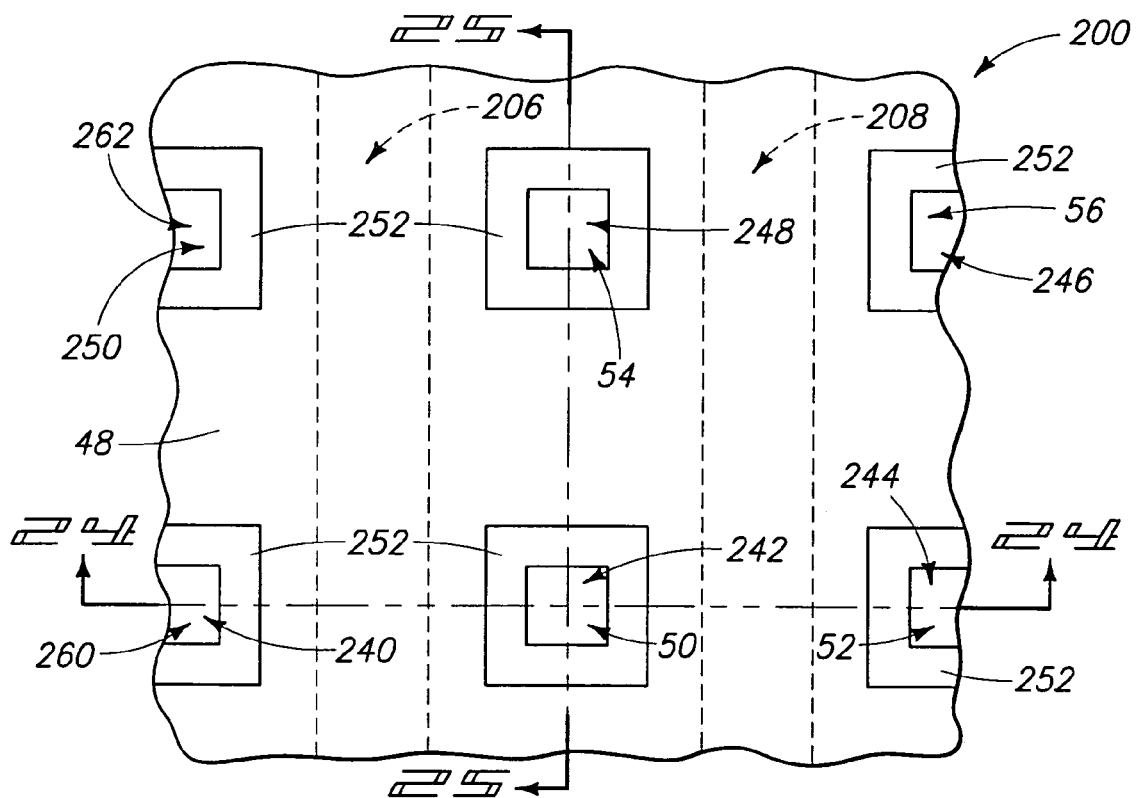

Referring next to FIGS. 23-25, conductively-doped semiconductor material is formed within openings 240, 242, 244, 246, 248 and 250 to form vertically-extending pillars 50, 52, 54, 56, 260 and 262. Each of the vertically-extending pillars comprises the channel region 58 and source/drain regions 60 and 62 described previously.

The semiconductive material of the vertically-extending pillars can comprise, consist essentially of, or consist of monocrystalline silicon. The monocrystalline silicon can be formed by epitaxially growing the silicon from the upper surface 17 of second doped semiconductor region 16 in applications in which region 16 comprises a monocrystalline silicon material. Alternatively, monocrystalline material of the vertically-extending pedestals can be formed by initially depositing amorphous silicon within the openings 240, 242, 244, 246, 248 and 262, and subsequently crystallizing the amorphous silicon to form a monocrystalline material within the openings. It can be preferred to utilize the deposition of amorphous silicon and subsequent crystallization for forming the monocrystalline material in applications in which it is desired to maintain a relatively low temperature during formation of monocrystalline material of the vertically-extending pedestals. It is to be understood that although it can be preferred that the material within the pedestals be monocrystalline, the invention encompasses other aspects in which the material within the pedestals comprises semiconductor material which is not monocrystalline.

The formation of doped regions 58, 60 and 62 preferably occurs during formation of the semiconductor material within the openings by in situ doping of the material. In other words, the lowest-most portions of the material are appropriately doped to be the source/drain region 60, the middle portions are then formed with appropriate doping to be channel regions 58, and finally the upper portions are formed with appropriate doping to be source/drain region 62. It is to be understood that other methods can be utilized for providing dopant within the vertically-extending pedestals in addition to, or alternatively to, the in situ provision of dopant within the semiconductor material of the pedestals.

In the shown preferred aspect of the invention, the pedestals are laterally offset from the bitline regions 26, 28, 30 and 32, and the bitline regions are not exposed during formation of the pedestals. Such can avoid metal migration that may otherwise occur from the silicide to the semiconductor material of the pedestals.

As discussed previously with reference to FIG. 1, the channel regions 58 will comprise a different dopant type than the source/drain regions 60 and 62. For instance, the channel regions 58 can comprise p-type dopant while the source/drain regions 60 and 62 comprise n-type dopant. Alternatively, the channel regions can comprise n-type dopant while the source/drain regions comprise p-type dopant.

The vertically-extending pillars are shown having uppermost surfaces which are coextensive with the uppermost surfaces of insulative material 48 and spacers 252. Such can be accomplished by appropriate planarization, such as, for example, chemical-mechanical polishing.

Figure 26:
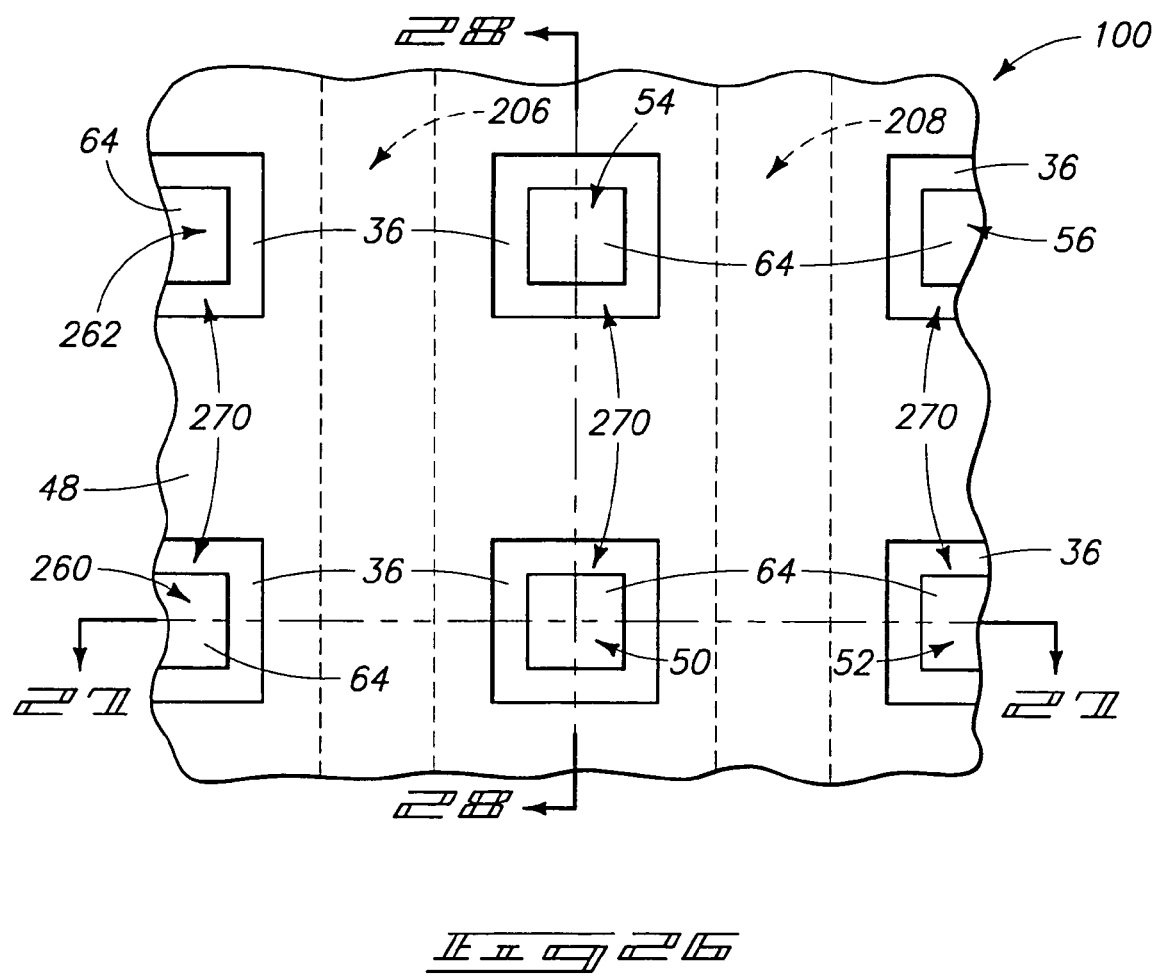
FIGS. 26-28 are views of the fragments of FIGS. 2-4, respectively, shown at a processing stage subsequent to that of FIGS. 23-25.
Figure 27:
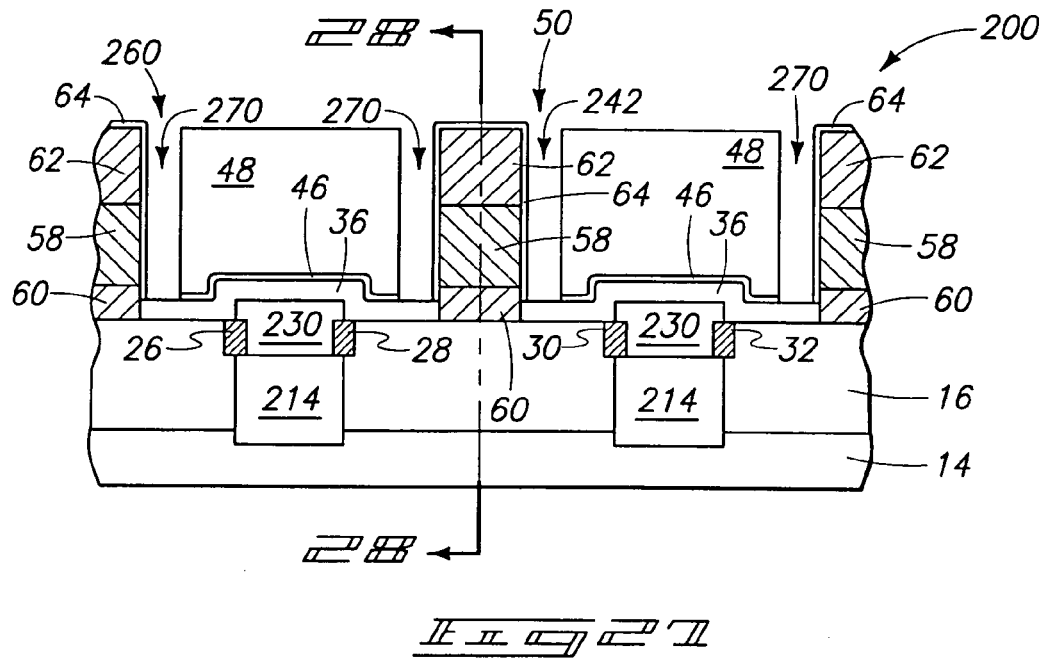
Figure 28:
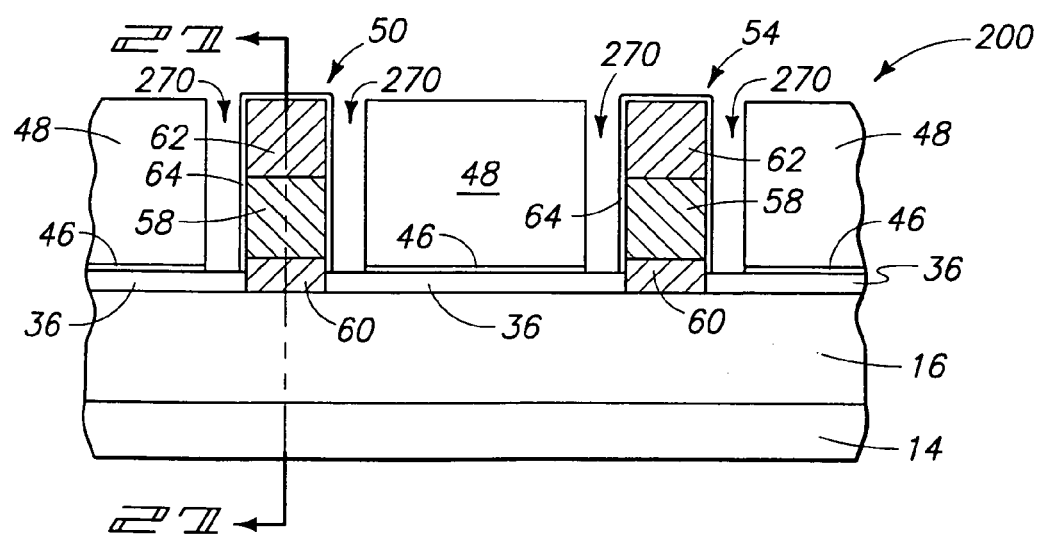

Referring next to FIGS. 26-28, spacers 252 (FIGS. 23-25) are removed, together with the portions of layer 46 beneath the spacers. Such removal leaves openings 270 surrounding the vertically-extending pedestals 50, 52, 54, 56, 260 and 262. The removal of the portion of material 46 to form openings 270 may recess the remaining material 46 under material 48 to form cavities at edges of material 48, depending on the processing conditions utilized. The cavities are not shown in the diagrams of FIGS. 27 and 28, as the cavities will typically be very small, to the extent, if any, that such cavities are formed.

The gate dielectric material 64 is formed within the openings, and specifically is formed along exposed surfaces of the vertically-extending pedestals. Gate dielectric 64 can comprise any suitable material, and in particular applications can comprise, consist essentially of, or consist of silicon dioxide. If the gate dielectric is silicon dioxide, such can be formed by exposing surfaces of the vertically-extending pillars to oxidizing conditions. Alternatively, the silicon dioxide can be formed by deposition of the silicon along the exposed surfaces of the vertically-extending pillars utilizing, for example, chemical vapor deposition or atomic layer deposition. If the silicon dioxide is formed by deposition, the silicon dioxide layer may extend over exposed surfaces of layers 36, 46 and 48, as well as over exposed surfaces of the vertically-extending pillars. The silicon dioxide over the surfaces of materials 36, 46 and 48 can be removed by protecting the silicon dioxide around the pillars with a suitable mask, and then utilizing an appropriate etch to remove the silicon dioxide. Alternatively, the silicon dioxide can be left on the surfaces of materials 36, 46 and 48.

Figure 29:
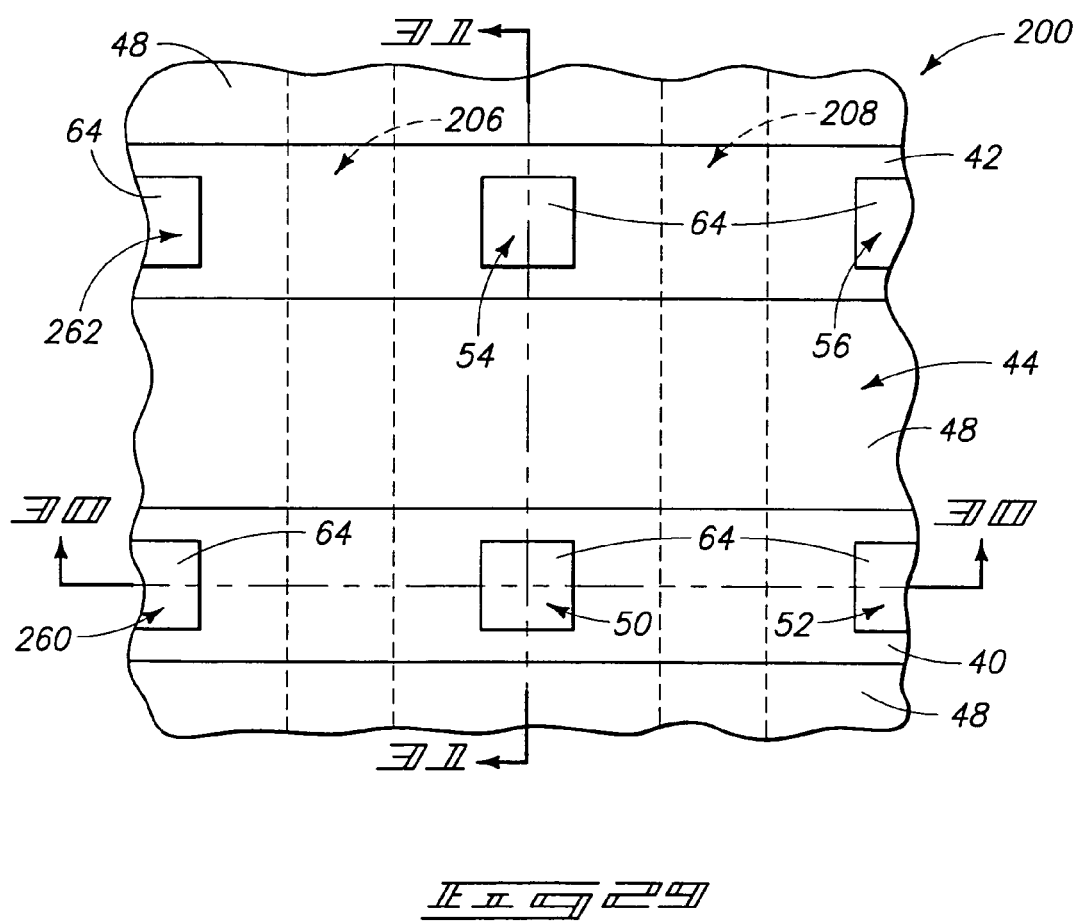
FIGS. 29-31 are views of the fragments of FIGS. 2-4, respectively, shown at a processing stage subsequent to that of FIGS. 26-28.
Figure 30:
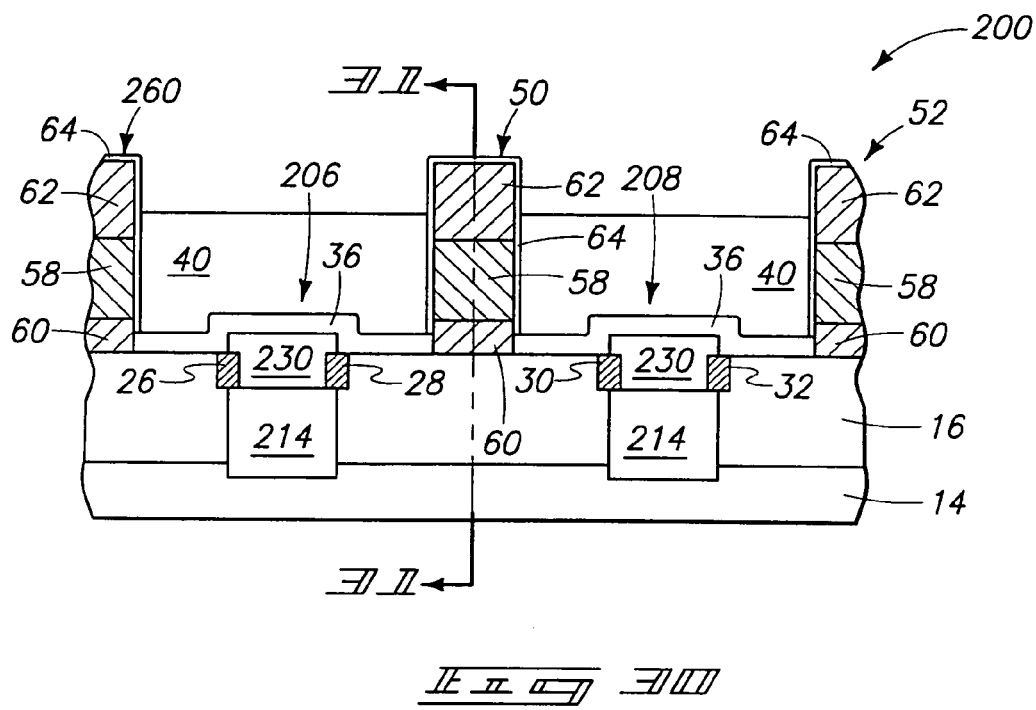
Figure 31:
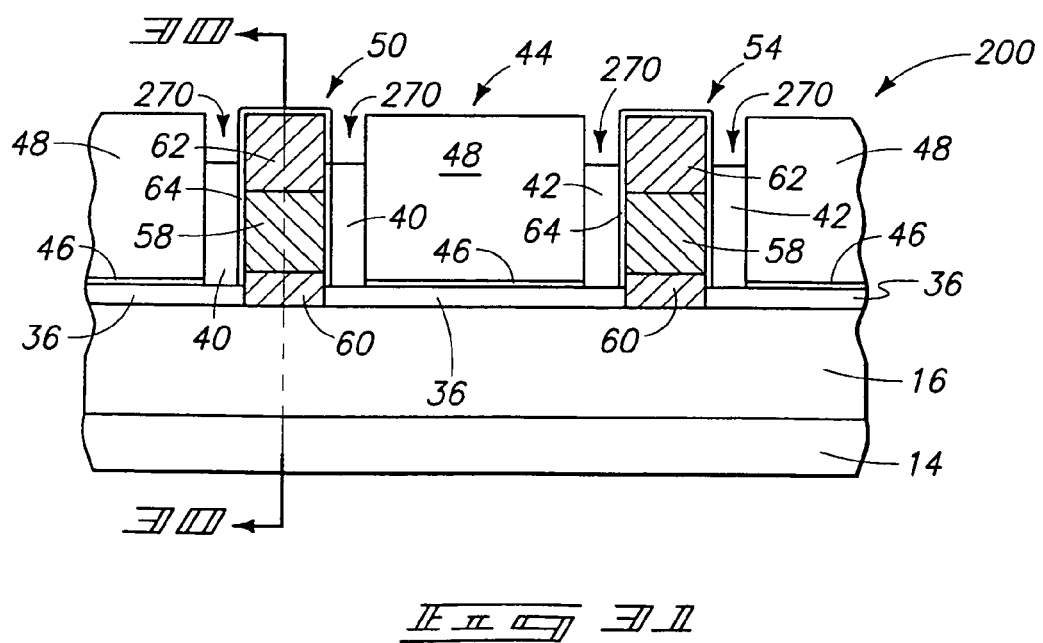

Referring next to FIGS. 29-31, portions of material 48 (and optionally the underlying material 46, as shown) are removed to leave strips of material 48 extending across construction 200. The strips of material 48 are shown extending horizontally in the top view of FIG. 29. The removal of material 48 (and optionally material 46) leaves openings between the strips, with such openings extending around pedestals 50, 52, 54, 56, 260 and 262. Conductive material is formed within the openings to form spaced wordlines 40 and 42. As discussed previously, the conductive material can comprise, consist essentially of, or consist of conductively-doped silicon, and in particular aspects will comprise amorphous silicon and/or polycrystalline silicon. The removal of the strips of insulative material 48 (and optionally material 46) and replacement of such strips with the conductive material of wordlines 40 and 42 forms the FIG. 1 structure comprising spaced wordlines 40 and 42 separated by insulative line 44. In subsequent processing, insulative materials can be formed over the wordlines 40 and 42, and capacitor constructions can be formed in electrical connection with the conductive pedestals to form a DRAM array of the type shown in FIG. 1. The silicide lines 26, 28, 30 and 32 form bitlines extending into the DRAM array. In some aspects, the bitlines within the array can consist essentially of, or consist of silicide, and the only bitlines within the array will be of the type corresponding to bitline 26, 28, 30 and 32. The portions of the bitlines outside the array can comprise other materials in addition to, or alternatively to, silicide.

If the conductive pedestals 50, 52, 54, 260 and 262 are incorporated into a DRAM array as DRAM unit cells, the DRAM unit cells can be substantially identical to one another in that the cells were formed simultaneously with one another and utilizing identical processes and conditions. Accordingly, the cells will be identical to one another within the tolerances of a semiconductor process utilized for forming the cells. The term "substantially identical" is utilized to indicate that the cells are identical to one another within the tolerances of a semiconductor fabrication process, rather than being identical within an absolute mathematical sense.

The construction of FIGS. 29-31 is in a sense an idealized construction, in that each of the vertically-extending pedestals is surrounded on all four sides by wordline material, and the wordlines are symmetric relative to the pedestals extending therethrough so that an equal amount of wordline material is on each of the opposing sides of the conductive pedestals in the FIG. 31 view. It is to be understood, however, that mask misalignments can occur so that the opposing sides of the pedestals of FIG. 31 do not contain equal amounts of conductive material, and also that there may be applications in which it is purposeful to have the conductive material extend less than fully around all four sides of a pedestal (or more generally, less than fully around the periphery of a pedestal), as well as in which it may be desired to have asymmetry relative to the amount of conductive material on one side of a pedestal versus on an opposing side of the pedestal.

Figure 32:
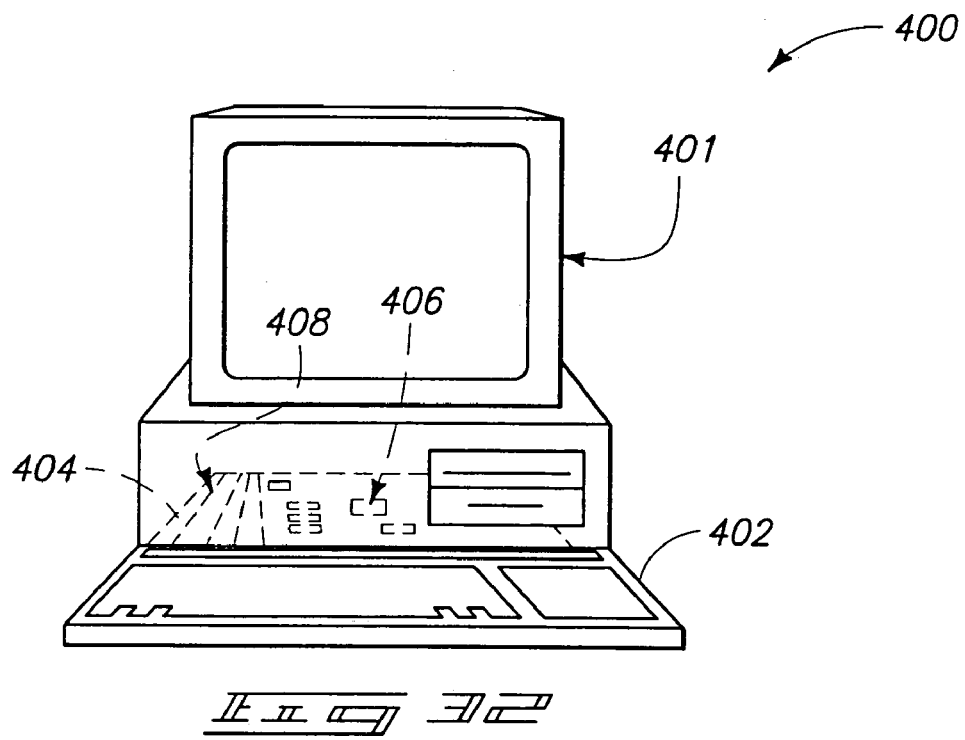
FIG. 32 is a diagrammatic view of a computer illustrating an exemplary application of the present invention.
Figure 33:
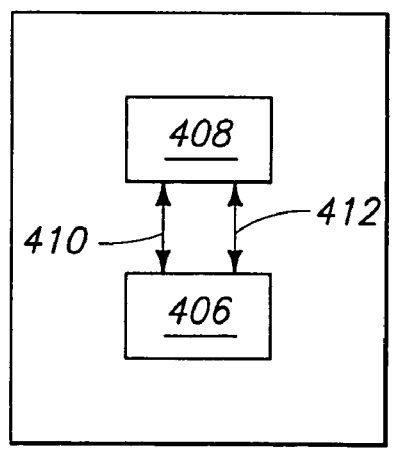
FIG. 33 is a block diagram showing particular features of the motherboard of the FIG. 32 computer.

FIG. 32 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 33. In such block diagram, the addressing circuitry is illustrated as 410 and the read circuitry is illustrated as 412. Various components of computer system 400, including processor 406, can comprise one or more of the memory constructions described previously in this disclosure.

Processor device 406 can correspond to a processor module, and associated memory utilized with the module can comprise teachings of the present invention.

Memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Memory device 408 can comprise memory formed in accordance with one or more aspects of the present invention.

Figure 34:
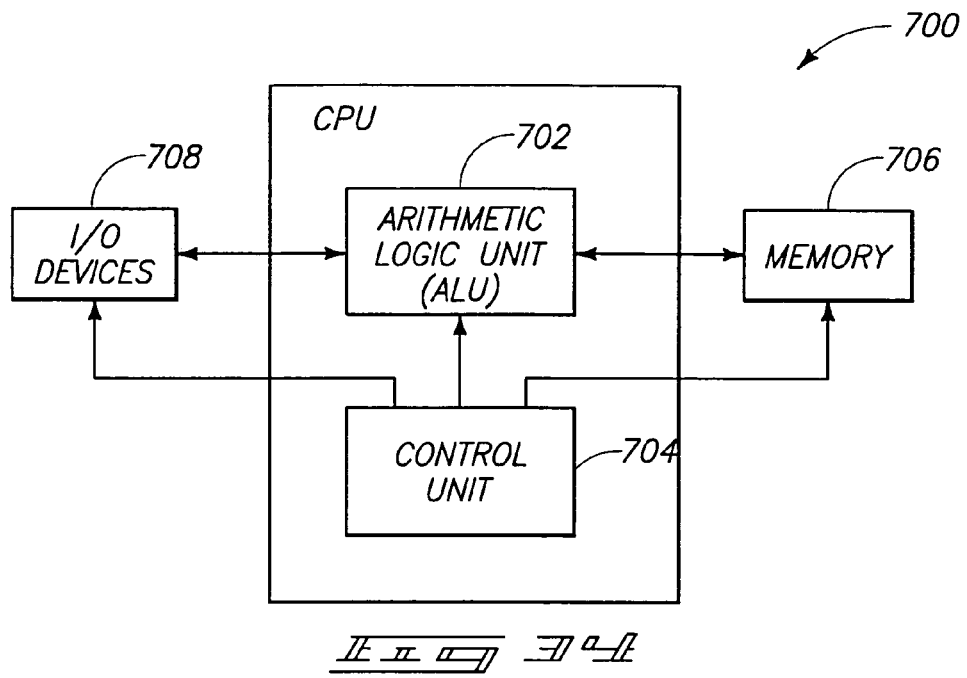
FIG. 34 is a high-level block diagram of an electronic system according to an exemplary aspect of the present invention.

FIG. 34 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include memory constructions in accordance with various aspects of the present invention.

Figure 35:
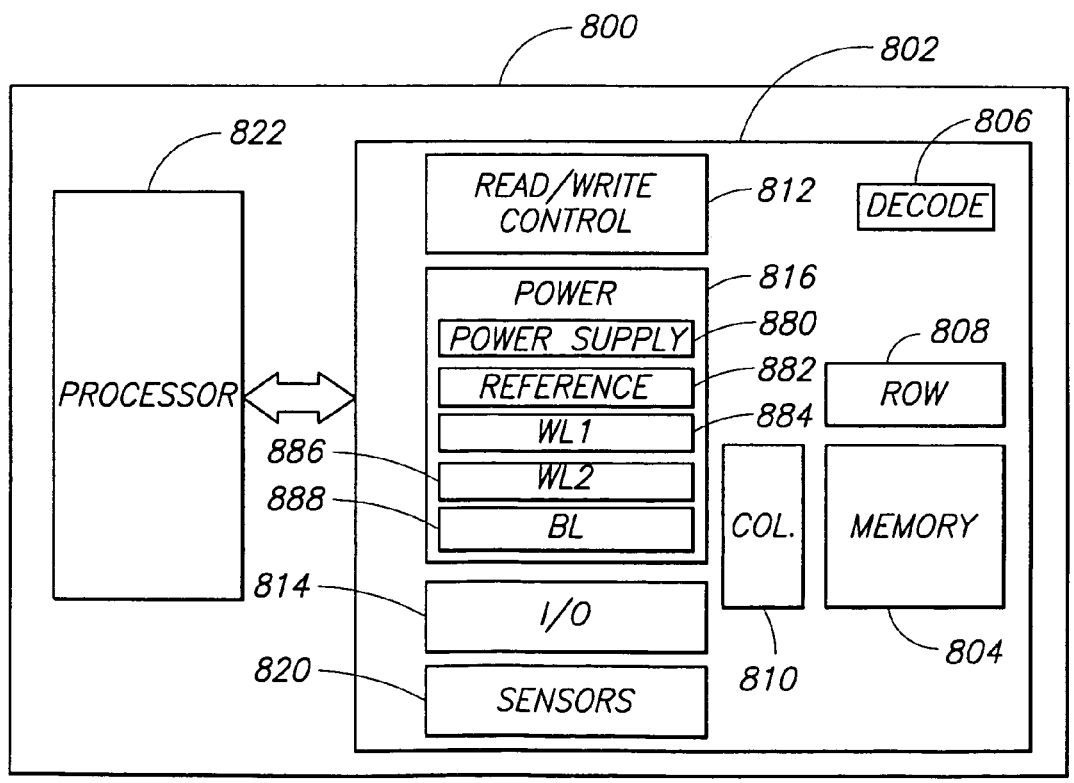
FIG. 35 is a simplified block diagram of an exemplary memory device according to an aspect of the present invention.

FIG. 35 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals 824 from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a memory construction of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor construction, comprising:
   a semiconductor substrate comprising a conductively-doped semiconductive material;
   a trenched isolation region within the conductively-doped semiconductive material, the trenched isolation region having a sidewall;
   a bitline between the sidewall of the trenched isolation region and the conductively-doped semiconductive material;
   a dielectric material over the bitline and trenched isolation region;
   a wordline over the dielectric material;
   a vertically-extending pillar proximate the wordline and comprising a channel region vertically between a pair of source/drain regions, the wordline comprising a transistor gate which gatedly connects the source/drain regions to one another through the channel region, one of the source/drain regions being electrically connected to the bitline; and
   wherein the vertically-extending pillar comprising the channel and the pair of the source/drain regions is spaced apart from and is not directly over the bitline.

2. The construction of claim 1 wherein the conductively-doped semiconductive material of the semiconductor substrate comprises silicon.

3. The construction of claim 1 wherein the bitline contains metal silicide.

4. The construction of claim 1 wherein the conductively-doped semiconductive material comprises monocrystalline semiconductive material, and wherein the vertically-extending pillar comprises a monocrystalline extension of said monocrystalline semiconductive material.

5. The construction of claim 1 wherein the source/drain regions of the vertically-extending pillar are n-type regions and the channel region of the vertically-extending pillar is a p-type region.

6. The construction of claim 1 wherein the source/drain regions of the vertically-extending pillar are p-type regions and the channel region of the vertically-extending pillar is an n-type region.

7. The construction of claim 1 wherein the dielectric material consists of silicon dioxide.

8. The construction of claim 1 wherein:
   the semiconductor substrate comprises a first doped region and a second doped region over the first doped region, one of the first and second doped regions being p-type and the other being n-type, the conductively-doped semiconductive material being the second doped region;
   the trenched isolation region extends through the second doped region and into the first doped region; and
   the silicide-containing bitline is within the second doped region and not within the first doped region of the substrate.

9. The construction of claim 8 wherein the first doped region is the p-type region.

10. The construction of claim 8 wherein the first doped region is the n-type region.

11. The construction of claim 1 wherein said one of the source/drain regions which is electrically connected with the bitline is a first source/drain region, wherein the other of the source/drain regions of the pair of source/drain regions is a second source/drain region and is electrically connected with a capacitor, and wherein the combination of the transistor gate, capacitor, source/drain regions and channel regions forms a DRAM unit cell.

12. A DRAM array comprising the DRAM unit cell of claim 11 together with a plurality of other DRAM unit cells substantially identical to the DRAM unit cell of claim 10.

13. An electronic device comprising the DRAM array of claim 12.

14. A semiconductor construction, comprising:
    a semiconductor substrate, the semiconductor substrate having a semiconductive material upper surface;
    an isolation region extending into the semiconductor substrate;
    a bitline between the isolation region and the semiconductor substrate;
    a spaced pair of wordlines over the bitline and isolation region, one of the pair of wordlines being a first wordline and the other being a second wordline;
    an electrically insulative line between the spaced pair of the wordlines;
    a first vertically-extending pillar of conductively-doped semiconductor material extending upwardly from the semiconductive material upper surface, the first vertically-extending pillar extending upwardly through the first wordline, the first vertically-extending pillar comprising a first pair of first type source/drain regions on vertically opposed sides of a second type first channel region, one of the first and second types being p-type and the other being n-type, the first pair of the first type source/drain regions being a first source/drain region and a second source/drain region, the first source/drain region being in electrical connection with the bitline, the first vertically-extending pillar being spaced apart from and not directly over the bitline;
    a second vertically-extending pillar of conductively-doped semiconductor material extending upwardly from the semiconductive material upper surface, the second vertically-extending pillar extending upwardly through the second wordline, the second vertically-extending pillar comprising a second pair of first type source/drain regions on vertically opposed sides of a second type second channel region, the second pair of the first type source/drain regions of the second vertically-extending pillar being a third source/drain region and a fourth source/drain region, the third source/drain region being in electrical connection with the bitline, the second vertically-extending pillar being spaced apart from and not directly over the bitline;
    a first gate dielectric around the first verticallypxtendin g pillar and separating the first vertically-extending pillar from the first wordline;
    a second gate dielectric around the second vertically-extending pillar and separating the second vertically-extending pillar from the second wordline;
    a first charge storage device in electrical connection with the second source/drain region; and
    a second charge storage device in electrical connection with the fourth source/drain region.

15. The construction of claim 14 wherein the first and second charge storage devices are capacitors.

16. The construction of claim 15 wherein the capacitors, source/drain regions and channel regions are incorporated within a pair of DRAM unit cells.

17. The DRAM unit cells of claim 16 wherein each of the unit cells, excluding the capacitors, is a 4F2 device.

18. A DRAM array comprising the DRAM unit cells of claim 16.

19. An electronic system comprising the DRAM array of claim 18.

20. The construction of claim 15 wherein the electrically insulative line comprises silicon dioxide.

21. The construction of claim 15 wherein the electrically insulative line comprises silicon dioxide over a high-k dielectric material.

22. The construction of claim 15 wherein the electrically insulative line consists of silicon dioxide over a high-k dielectric material.

23. The construction of claim 22 wherein the high-k dielectric material consists of one or both of aluminum oxide and hafnium oxide.

24. The construction of claim 15 further comprising a high-k dielectric material between the isolation region and the electrically insulative line.

25. The construction of claim 24 wherein the high-k dielectric material consists of one or both of aluminum oxide and hafnium oxide.

26. The construction of claim 24 further comprising a low-k dielectric material between the isolation region and the high-k dielectric material.

27. The construction of claim 26 wherein the low-k dielectric material is between the first and second wordlines and the semiconductive material upper surface of the semiconductor substrate.

28. The construction of claim 27 wherein the high-k dielectric material is not between the first and second wordlines and the semiconductive material upper surface of the semiconductor substrate.

29. The construction of claim 26 wherein the low-k dielectric material comprises silicon dioxide and wherein the high-k dielectric material comprises one or both of aluminum oxide and hafnium oxide.

30. The construction of claim 26 wherein the low-k dielectric material consists of silicon dioxide.

31. The construction of claim 15 wherein the first and second gate dielectrics comprise silicon dioxide.

32. The construction of claim 15 wherein the first and second gate dielectrics consist of silicon dioxide.

33. The construction of claim 15 wherein the first and second wordlines comprise conductively-doped silicon.

34. The construction of claim 15 wherein the first and second wordlines consist of conductively-doped silicon.

35. The construction of claim 15 wherein the bitline comprises metal silicide.

36. The construction of claim 15 wherein the bitline consists of metal silicide.

* * * * *

UNITED STATES PATENT AND TRADEMARK OFFICE
CERTIFICATE OF CORRECTION

PATENT NO. : 7,453,103 B2 Page 1 of 1
APPLICATION NO. : 11/285424
DATED : November 18, 2008
INVENTOR(S) : Abbott et al.

It is certified that error appears in the above-identified patent and that said Letters Patent is hereby corrected as shown below:

In column 16, line 58, in Claim 14, delete "verticallypxtendin g" and insert -- vertically-extending --, therefor.

In column 17, line 7, in Claim 17, delete "4F2" and insert -- $4F^2$ --, therefor.

Signed and Sealed this

Third Day of March, 2009

JOHN DOLL
*Acting Director of the United States Patent and Trademark Office*